(12) United States Patent
Okajima

(10) Patent No.: US 8,836,008 B2
(45) Date of Patent: Sep. 16, 2014

(54) SEMICONDUCTOR DEVICE AND METHOD OF MANUFACTURING SAME

(75) Inventor: Mutsumi Okajima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 35 days.

(21) Appl. No.: 13/420,649

(22) Filed: Mar. 15, 2012

(65) Prior Publication Data

US 2012/0248547 A1 Oct. 4, 2012

Related U.S. Application Data

(62) Division of application No. 11/870,735, filed on Oct. 11, 2007, now abandoned.

(30) Foreign Application Priority Data

Oct. 19, 2006 (JP) ................................. 2006-285301

(51) Int. Cl.
*H01L 29/66* (2006.01)
*H01L 27/115* (2006.01)
*H01L 21/768* (2006.01)

(52) U.S. Cl.
CPC .... *H01L 21/76897* (2013.01); *H01L 27/11524* (2013.01); *H01L 27/11521* (2013.01); *H01L 27/115* (2013.01)
USPC .......................................................... 257/315

(58) Field of Classification Search
CPC ........................ H01L 29/66833; H01L 29/792
USPC ............................................. 257/315, E27.076
See application file for complete search history.

(56) References Cited

U.S. PATENT DOCUMENTS

| 6,995,414 | B2 | 2/2006 | Yaegashi |
| 7,078,813 | B2 | 7/2006 | Sakuma et al. |
| 2004/0227177 | A1 | 11/2004 | Yoshioka et al. |
| 2005/0266634 | A1 * | 12/2005 | Park et al. ..................... 438/238 |
| 2006/0028855 | A1 | 2/2006 | Matsunaga et al. |
| 2006/0065913 | A1 | 3/2006 | Sakuma et al. |

\* cited by examiner

*Primary Examiner* — Tran Tran
(74) *Attorney, Agent, or Firm* — Finnegan, Henderson, Farabow, Garrett & Dunner, L.L.P.

(57) ABSTRACT

Certain embodiments provide a semiconductor device comprising a plurality of memory cell arrays each of which includes a plurality of memory cell transistors and select transistors each of which is disposed at either end of the memory cell transistors, a diffused layer formed between a first and a second select transistors adjacent to each other, a first sidewall film formed on each of the opposed sidewalls of said first and second select transistors, a second sidewall film formed on said first sidewall film, and a conducting layer which contacts with said diffused layer. The second sidewall film covers at least part of the top surface and the side surface of said first sidewall film. The edge of said contact portion is positioned at a distance no less than the total thickness of said first and second sidewall films from the sidewalls of said first and second select transistors.

13 Claims, 19 Drawing Sheets

SEMICONDUCTOR DEVICE AND METHOD OF MANUFACTURING SAME

CROSS REFERENCE TO RELATED APPLICATION

This is a division of application Ser. No. 11/870,735, filed Oct. 11, 2007 now abandoned, which is incorporated herein by reference.

This application is based upon and claims benefit of priority from the Japanese Patent Application No. 2006-285301, filed on Oct. 19, 2006, the entire contents of which are incorporated herein by reference.

BACKGROUND OF THE INVENTION

1. Field of the Invention

The present invention relates to a semiconductor device and a method of manufacturing the same.

2. Related Art

Along with the miniaturization of semiconductor devices, it is desired to also miniaturize contacts for electrically connecting the impurity-diffused layer of a semiconductor substrate with a wiring line or the like.

As a manufacturing method advantageous to miniaturization, there is known a method including:

forming a diffused layer on the principal surface of a semiconductor substrate between select gate electrodes formed thereon;

forming a first barrier film on the sidewalls of the select gate electrodes and on the diffused layer;

forming a first insulating layer on the first barrier film;

forming silicide layers on the select gate electrodes;

forming a second barrier film on the silicide layers and on the first insulating layer;

forming an opening having a first width in the second barrier film on the diffused layer;

forming a second insulating layer on the second barrier film;

forming a mask layer on the second insulating layer;

forming an opening having a second width larger than the first width in the mask layer on the opening;

forming the upper portion of a contact hole having a bottom as wide as the second width by carrying out etching using the mask layer as a mask;

forming in the second barrier film the lower portion of the contact hole having a first width W1 and being as deep as to penetrate through the first insulating layer and the first barrier film and reach the diffused layer by starting etching from the position of the opening; and burying a conducting layer in the upper and lower portions of the contact hole, thereby forming a contact.

In addition, in order to reduce the resistance of bit line contacts of a NAND-type flash memory, there is known a method of forming a low-concentration impurity-diffused layer on the surface of a semiconductor substrate between select transistors, forming a high-concentration impurity-diffused layer in the center of this low-concentration impurity-diffused layer, creating a contact hole on the high-concentration impurity-diffused layer, and burying a Ti/TiN laminated barrier metal film and a tungsten (W) film in the contact hole, thereby forming a bit line contact.

When forming such a bit line contact using such a method as described above, there may arise a displacement in the position where an opening having a first width W1 is to be formed due to misalignment in lithography, thereby causing part of the bottom surface of the bit line contact to protrude out of the high-concentration impurity-diffused layer into the low-concentration impurity-diffused layer.

The above-described method thus has the problem that if such protrusion into the low-concentration impurity-diffused layer as described above occurs, Ti and the substrate (silicon) react with each other in the low-concentration impurity-diffused layer to form a Ti silicide when filling the contact hole with the Ti/TiN laminated barrier metal film and the W film, resulting in junction leakage, since the low-concentration impurity-diffused layer is designed to be shallower than the high-concentration impurity-diffused layer.

The method also has the problem that bit line leakage occurs since a depletion layer is formed on the surface of the low-concentration impurity-diffused layer in the vicinity of the select transistors due to the electric fields thereof and a Ti silicide is formed in this depletion layer.

These problems can be avoided by reducing the size of the contacts (contact holes) or by increasing the distance between the select gate electrodes. However, reducing the size of contacts is makes it difficult to ensure a sufficient lithographic margin when forming a resist pattern for contacts in lithography, thereby leading to a decrease in the yield. Furthermore, increasing the distance between the select gate electrodes involves an increase in the chip size, resulting in a decrease in the number of chips produced from a single wafer.

SUMMARY OF THE INVENTION

According to one aspect of the present invention, there is provided a semiconductor device comprising:

a semiconductor substrate;

a transistor region formed on said semiconductor substrate and having a plurality of memory cell arrays formed of a plurality of memory cell transistors and select transistors one each of which is disposed on one and the other sides of said plurality of memory cell transistors;

a diffused layer formed on the surface of said semiconductor substrate between the adjacent first and a second select transistors of said memory cell arrays in said transistor region;

a first sidewall film formed on each of the opposed sidewalls of said first and second select transistors adjacent to each other;

a second sidewall film formed on said first sidewall film; and a conducting layer formed between said first and second select transistors, so as to contact with said diffused layer, wherein the edge of a contact portion is positioned at a distance no less than the thickness of said second sidewall film from the sidewalls of said first and second select transistors.

According to one aspect of the present invention, there is provided a method of manufacturing a semiconductor device comprising:

forming on a semiconductor substrate a plurality of memory cell arrays having a plurality of memory cell transistors and select transistors one each of which is disposed on one and the other sides of said plurality of memory cell transistors;

forming a first diffused layer on the surface of said semiconductor substrate between said memory cell transistors, between said memory cell transistors and said select transistors and between said select transistors disposed at the ends of said memory cell arrays adjacent to each other;

forming a first insulating film so as to fill spaces between said memory cell transistors, between said memory cell transistors and said select transistors and between said select transistors disposed at the ends of said memory cell arrays adjacent to each other;

removing said first insulating film so that sidewall films having a first predetermined value of film thickness are formed between said select transistors on the sidewall thereof;

forming a second diffused layer on the surface of said semiconductor substrate between said select transistors using said sidewall films as masks;

removing said sidewall films;

forming a second insulating film for covering the side and bottom surfaces of an area between said select transistors;

forming third insulating films on the lateral sides of said second insulating film so that the total thickness of said third insulating film and said second insulating film amounts to a second predetermined value equal to or greater than said first predetermined value;

forming a fourth insulating film so as to fill a space between said third insulating films;

creating an opening between said select transistors whereby the top surface of said second diffused layer is exposed; and burying a conductive material in said opening to form a contact portion.

According to one aspect of the present invention, there is provided a method of manufacturing a semiconductor device comprising:

forming on a semiconductor substrate a plurality of memory cell arrays having a plurality of memory cell transistors and select transistors one each of which is disposed on one and the other sides of said plurality of memory cell transistors;

forming a first diffused layer on the surface of said semiconductor substrate between said memory cell transistors, between said memory cell transistors and said select transistors and between said select transistors disposed at the ends of said memory cell arrays adjacent to each other;

forming a first insulating film so as to fill spaces between said memory cell transistors, between said memory cell transistors and said select transistors and between said select transistors disposed at the ends of said memory cell arrays adjacent to each other;

removing said first insulating film so that sidewall films having a first predetermined value of film thickness are formed between said select transistors on the sidewall thereof;

forming a second diffused layer on the surface of said semiconductor substrate between said select transistors using said sidewall films as masks;

forming a second insulating film so as to fill a space between said sidewall films;

removing said sidewall films and said second insulating film so that the predetermined heights thereof are reached;

forming a third insulating film having a second predetermined value of film thickness equal to or greater than said first predetermined value by covering the side surface and bottom surface of an area between said select transistors;

forming a fourth insulating film on said third insulating film so as to fill a space between said select transistors;

creating an opening between said select transistors whereby the top surface of said second diffused layer is exposed; and burying a conductive material in said opening to form a contact portion.

DESCRIPTION OF THE EMBODIMENTS

Hereinafter, an explanation will be made of a semiconductor device and a method of manufacturing the semiconductor device in accordance with the embodiments of the present invention with reference to the accompanying drawings.

First Embodiment

Now, an explanation will be made of a method of manufacturing a semiconductor device in accordance with the first embodiment of the present invention using FIGS. 1 to 15.

Figure 1:
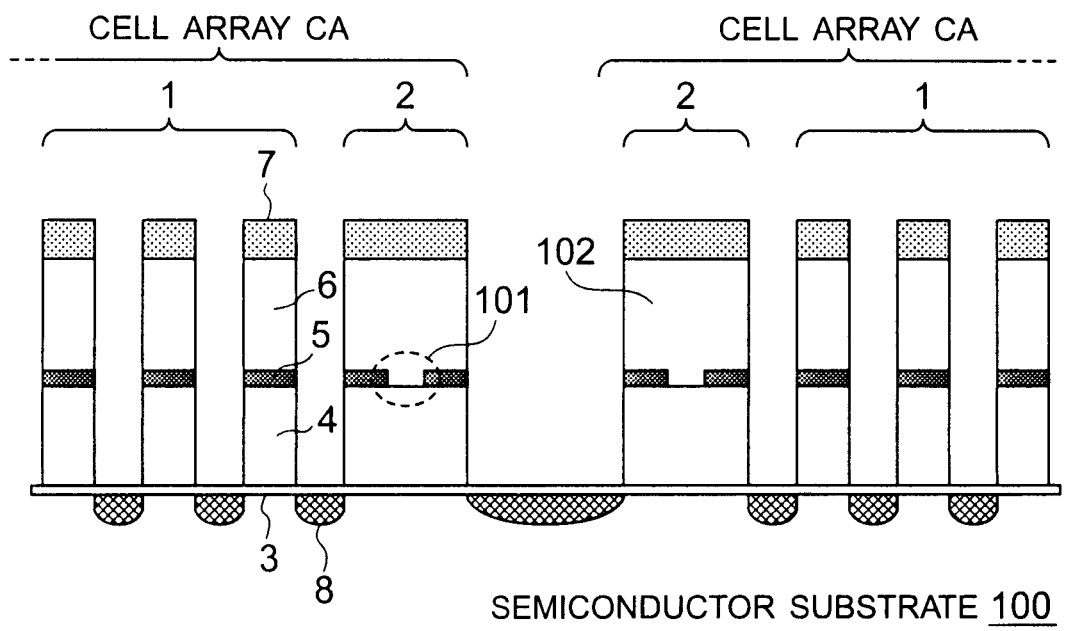
FIG. 1 is a schematic view showing a cross-sectional process drawing of a method of manufacturing a semiconductor device in accordance with the first embodiment of the present invention.

First, as shown in FIG. 1, there are formed on a silicon substrate 100 a plurality of cell arrays CA, in which one each of select transistors 2 is disposed on one and the other side of a plurality of memory cell transistors 1, using a publicly-known process. There are also formed peripheral transistors and element-isolating regions (both are not shown in the figure).

Each memory cell transistor 1 has a tunnel-insulating film 3 on the silicon substrate 100, a floating gate electrode 4 formed of polysilicon, an inter-poly insulating film 5, and a control gate electrode 6 formed of polysilicon.

In addition, a silicon nitride film 7 is overlaid on the control gate electrode 6 as a hard mask material used at the time of processing. The film thicknesses of the floating gate electrode 4, inter-poly insulating film 5, control gate electrode 6, and silicon nitride film 7 are, for example, 90 nm, 15 nm, 150 nm and 50 nm, respectively.

While the select transistors 2 and the peripheral transistors are the same in configuration as the memory cell transistors 1, an opening 101 is formed in part of each inter-poly insulating film 5, thereby connecting the floating gate electrode 4 and the control gate electrode 6 to each other to form a gate electrode 102.

In addition, a low-concentration impurity-diffused layer 8 is formed on the surface of the semiconductor substrate 100 between respective transistors by performing ion implantation using the floating gate electrodes 4 and the control gate electrodes 6 as masks.

In a cell array portion where the memory cell transistors 1 and the select transistor 2 are formed, the low-concentration impurity-diffused layer 8 is formed by ion-implanting P or As as an impurity at a dosage of, for example, $1E13/cm^2$. In a peripheral circuit area where the peripheral transistors are formed, the low-concentration impurity-diffused layer 8 is formed by ion-implanting P, As or B as an impurity, depending on the type of transistors, at a dosage of, for example, $1E11$ to $1E13/cm^2$.

The distances between the memory cell transistors 1 and between each plurality of memory cell transistors 1 and each select transistor 2 are, for example, 55 nm, and the distance between the select transistors 2 is, for example, 300 nm.

Figure 2:
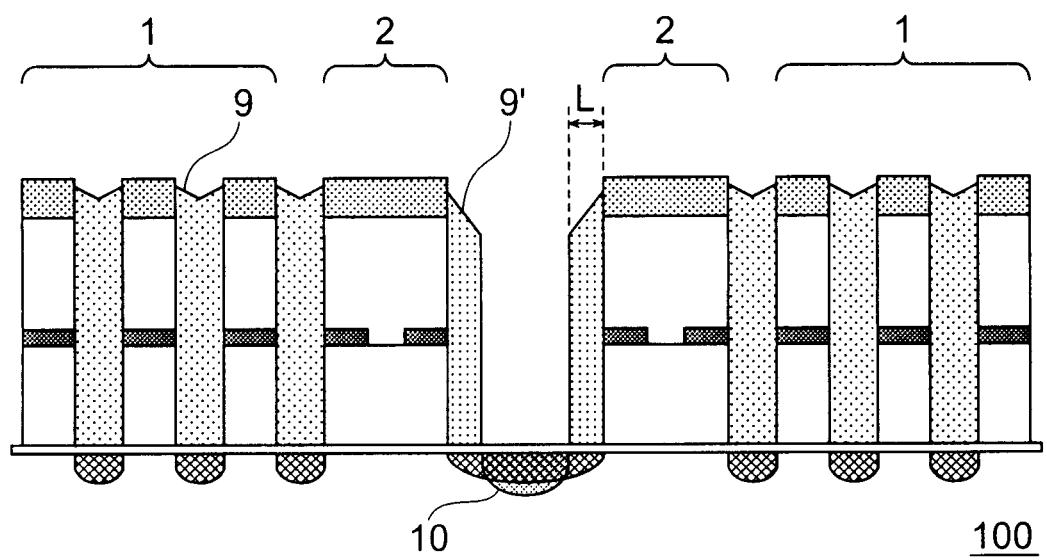
FIG. 2 is a schematic view showing another cross-sectional process drawing of a method of manufacturing the semiconductor device in accordance with the first embodiment of the present invention.

As shown in FIG. 2, a silicon dioxide film 9 is deposited using a CVD method to fill spaces between the memory cell transistors 1, between each select transistor 2 and each plurality of memory cell transistors 1, and between the select transistors 2. Then, spacers 9' are formed between the select transistors 2 on the lateral sides thereof by etching back the silicon dioxide film 9 using a dry etching method. The spacers 9' are likewise formed in the peripheral circuit area (not shown in the figure). The width L of the spacers 9' is, for example, 50 nm.

Then, a high-concentration impurity-diffused layer 10 is formed between the select transistors 2 and in the peripheral circuit area by performing ion implantation. In an area between the select transistors 2 and in N-type peripheral transistors, the high-concentration impurity-diffused layer 10 is formed by ion-implanting As at a dosage of, for example, $1E15/cm^2$. In P-type peripheral transistors, the high-concentration impurity-diffused layer 10 is formed by ion-implanting B at a dosage of, for example, $1E15/cm^2$.

Figure 3:
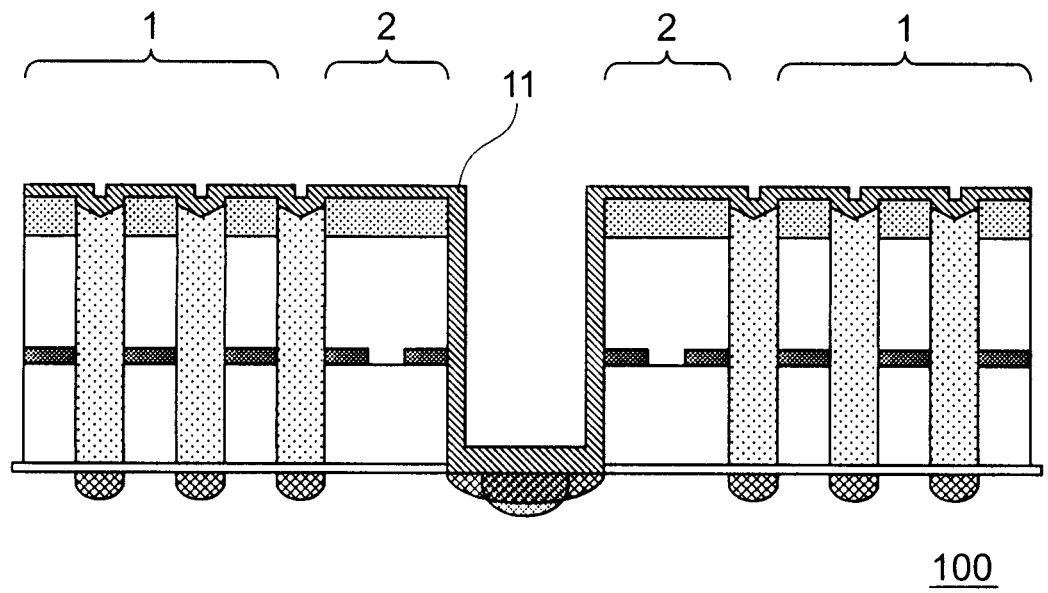
FIG. 3 is a schematic view showing yet another cross-sectional process drawing of a method of manufacturing the semiconductor device in accordance with the first embodiment of the present invention.

As shown in FIG. 3, the spacers 9' formed on the lateral sides of the select transistors 2 are removed using a photolithography method and a wet etching method.

Then, a silicon nitride film 11 having a thickness of, for example, 20 nm is deposited so as to cover the top surfaces of the memory cell transistors 1, the select transistors 2, each silicon dioxide film 9 between the memory cell transistors 1, each silicon dioxide film 9 between each plurality of memory cell transistors 1 and each select transistor 2, and the side surfaces and the bottom surface of an area between the select transistors 2.

Figure 4:
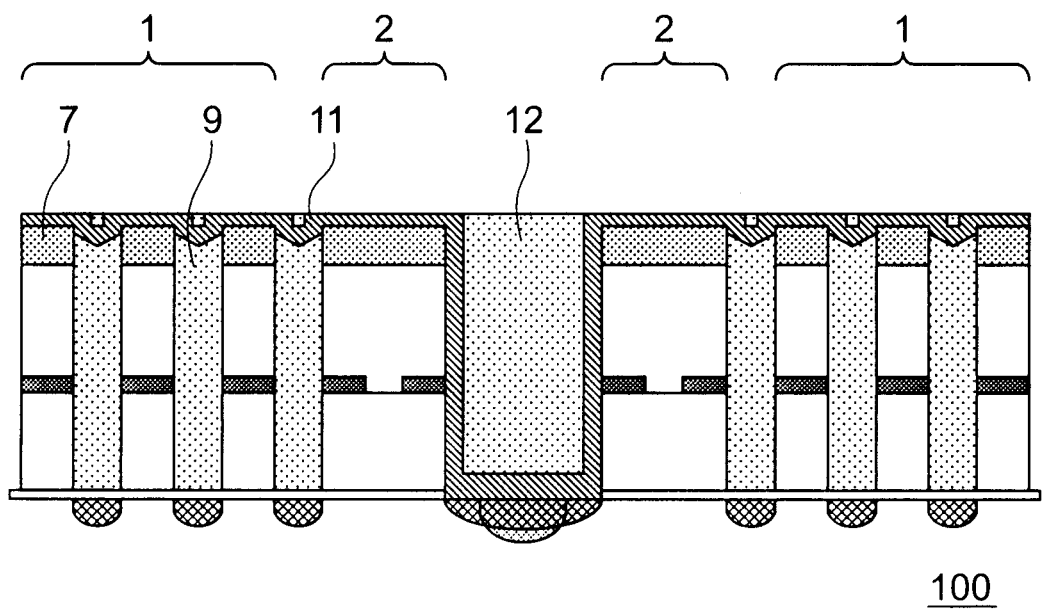
FIG. 4 is a schematic view showing still another cross-sectional process drawing of a method of manufacturing the semiconductor device in accordance with the first embodiment of the present invention.

As shown in FIG. 4, a silicon dioxide film 12 is deposited using a CVD method, so as to fill an area between the select transistors 2, and the silicon dioxide film 12 is planarized by means of CMP using the silicon nitride film 11 as a stopper film.

Figure 5:
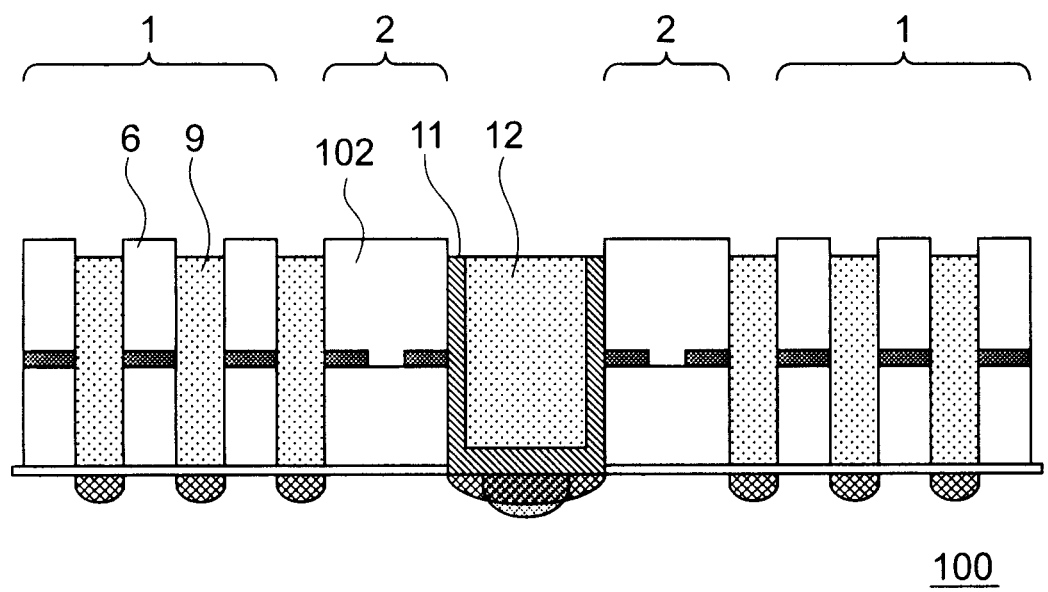
FIG. 5 is a schematic view showing still another cross-sectional process drawing of a method of manufacturing the semiconductor device in accordance with the first embodiment of the present invention.

As shown in FIG. 5, the silicon nitride films 7 and 11 and the silicon dioxide films 9 and 12 are removed using a dry etching method, so as to expose the top surfaces of the control gate electrodes 6 of the memory cell transistors 1 and the gate electrodes 102 of the select transistors 2 and peripheral transistors.

Figure 6:
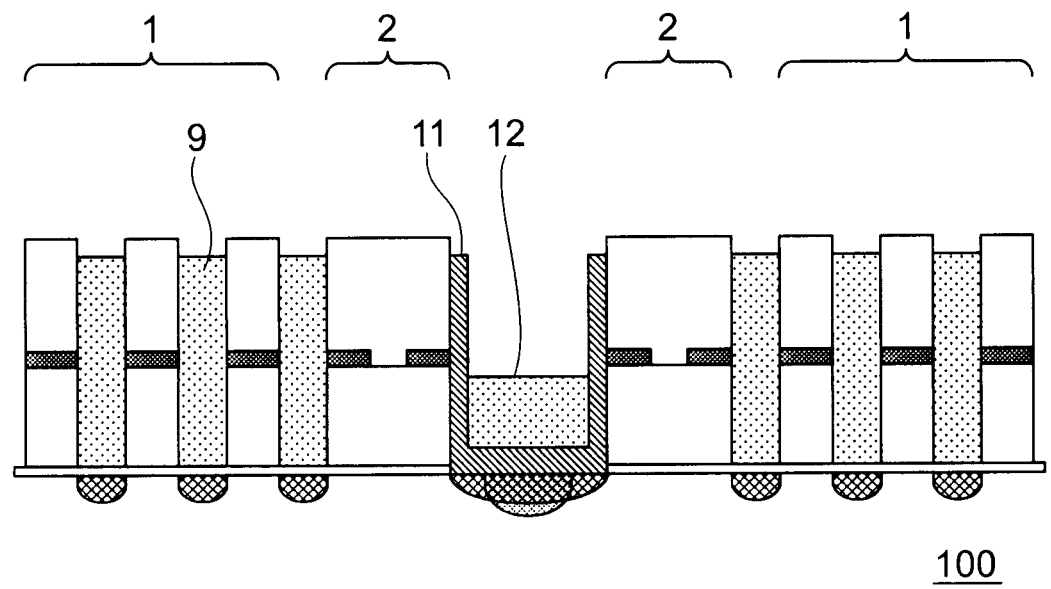
FIG. 6 is a schematic view showing still another cross-sectional process drawing of a method of manufacturing the semiconductor device in accordance with the first embodiment of the present invention.

As shown in FIG. 6, part of the silicon dioxide film 12 buried between the select transistors 2 is removed using a lithography method and a wet etching or dry etching method.

Figure 7:
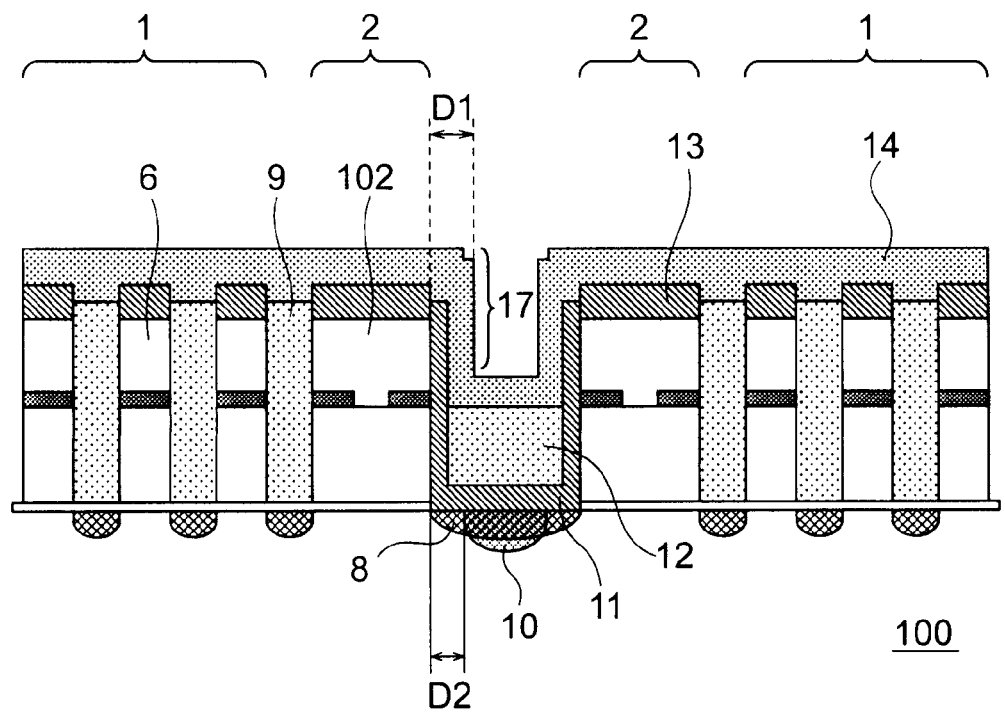
FIG. 7 is a schematic view showing still another cross-sectional process drawing of a method of manufacturing the semiconductor device in accordance with the first embodiment of the present invention.

As shown in FIG. 7, a silicide film 13 formed of titanium (Ti), cobalt (Co), nickel (Ni), or the like is formed on the top surfaces of exposed polysilicon (control gate electrodes 6 and gate electrodes 102) using a publicly-known salicide technique.

In addition, a silicon nitride film 14 is deposited using a CVD method, so as to cover the top surfaces of the silicon dioxide films 9, select transistors 2 and memory cell transistors 1 and the side surfaces (surface of the silicon nitride film 11) and the bottom surface (top surface of the silicon dioxide film 12) of an area between the select transistors 2.

Consequently, a vertical step 17 formed of silicon nitride film is formed between the select transistors 2. The height of the vertical step 17 is controlled by the amount of silicon dioxide film 12 etched in preceding processes.

Assuming here that the distance from the sidewall of each select transistor 2 to the vertical surface of the vertical step 17 (total thickness of the silicon nitride films 11 and 14) is D1 and the distance from the side surface of each select transistor 2 to the end of the high-concentration impurity-diffused layer 10 (region the impurity concentration of which is higher than that of the low-concentration impurity-diffused layer 8) is D2, the silicon nitride film 14 is deposited so that D1≥D2 holds true.

Assuming that the width L of the spacer 9' serving as a mask when forming the high-concentration impurity-diffused layer 10 is 50 nm, for example, then D2≈50 nm. Assuming that the thickness of the silicon nitride film 11 is 20 nm, then the distance D1≈60 (=20+40) nm is satisfied by depositing the silicon nitride film 14 to a thickness of 40 nm and, therefore, D1≥D2 holds true.

Figure 8:
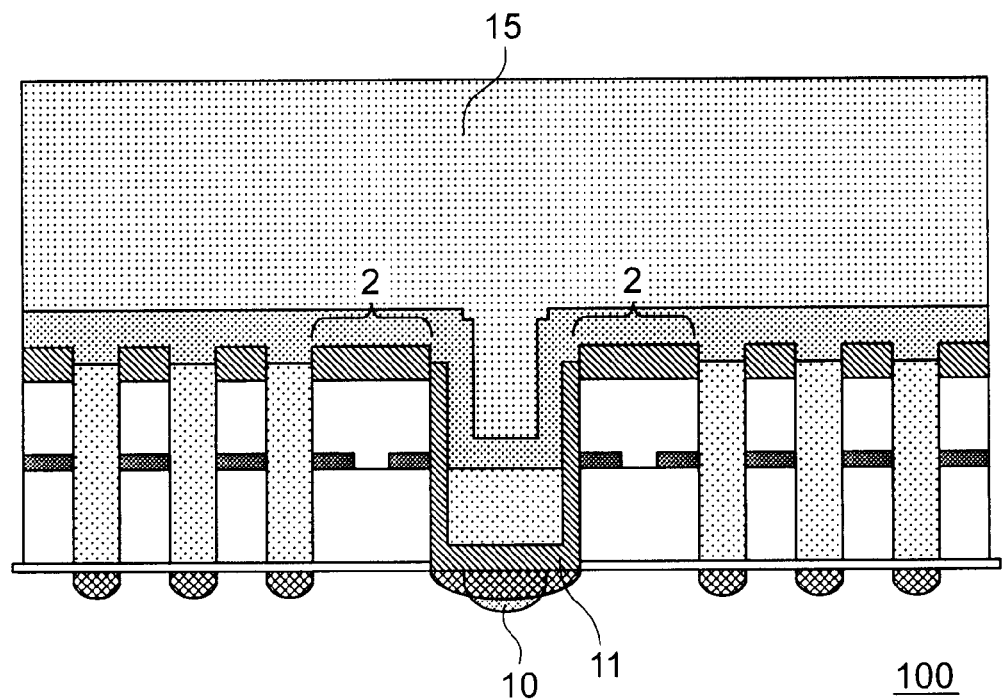
FIG. 8 is a schematic view showing still another cross-sectional process drawing of a method of manufacturing the semiconductor device in accordance with the first embodiment of the present invention.

As shown in FIG. 8, a silicon dioxide film 15 is deposited so as to fill a space between the select transistors 2.

Figure 9:
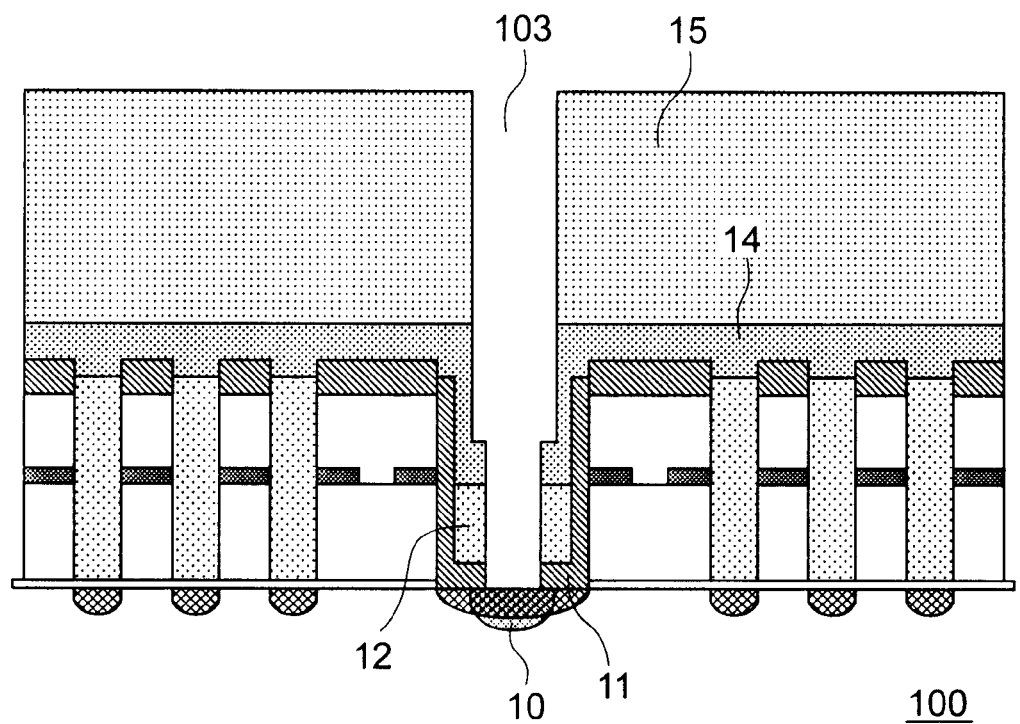
FIG. 9 is a schematic view showing still another cross-sectional process drawing of a method of manufacturing the semiconductor device in accordance with the first embodiment of the present invention.

As shown in FIG. 9, a contact hole 103 is created between the select transistors 2 using lithography and dry etching methods. At the time of dry etching, the silicon dioxide film 15 is first etched under the etching condition (defined as condition 1) that a silicon dioxide film has a higher selection ratio than a silicon nitride film.

Then, the silicon nitride film 14 is etched under the etching condition (defined as condition 2) that a silicon nitride film has a higher selection ratio than a silicon dioxide film. Next, the silicon dioxide film 12 is etched under condition 1. Then, the silicon nitride film 11 is etched under condition 2 to expose the top surface of the high-concentration impurity-diffused layer 10. Note that this series of etching may be carried out within the same chamber.

Figure 10:
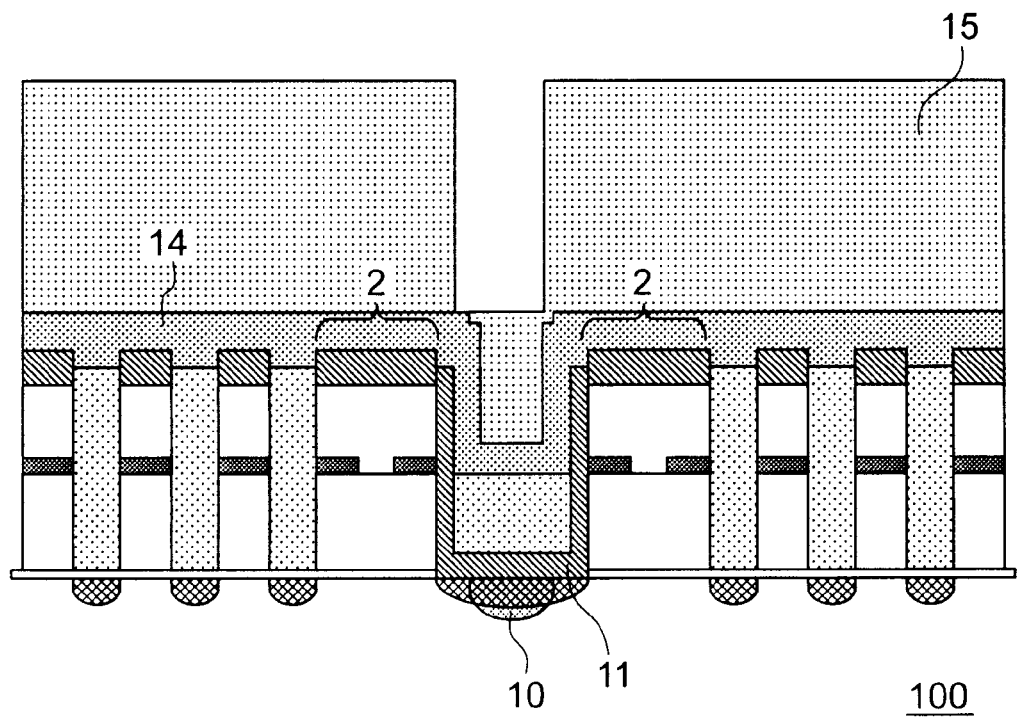
FIG. 10 is a schematic view showing still another cross-sectional process drawing of a method of manufacturing the semiconductor device in accordance with the first embodiment of the present invention.

As shown in FIG. 10, for example, if the position to create a contact hole in is displaced due to misalignment in lithography, the etching of the silicon dioxide film 15 proceeds as far as the top surface of the silicon nitride film 14 on the select transistors 2 with this position of contact hole creation kept displaced.

Figure 11:
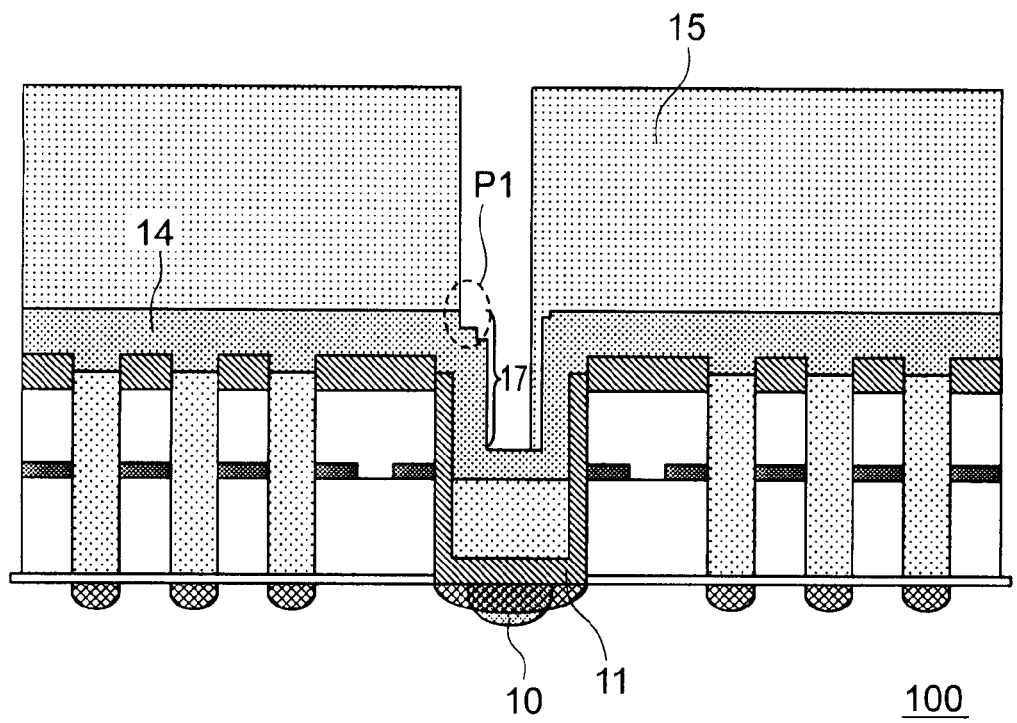
FIG. 11 is a schematic view showing still another cross-sectional process drawing of a method of manufacturing the semiconductor device in accordance with the first embodiment of the present invention.

Since etching is carried out under the etching condition that a silicon dioxide film has a higher selection ratio than a silicon nitride film, the part P1 of the vertical step 17 is subsequently etched away, as shown in FIG. 11, while the etching of the silicon dioxide film 15 proceeds as far as the top surface of the silicon nitride film 14 between the select transistors 2.

The etched away amount of this part P1 is smaller than that of the silicon dioxide film 15 due to a difference in the selection ratio.

Figure 12:
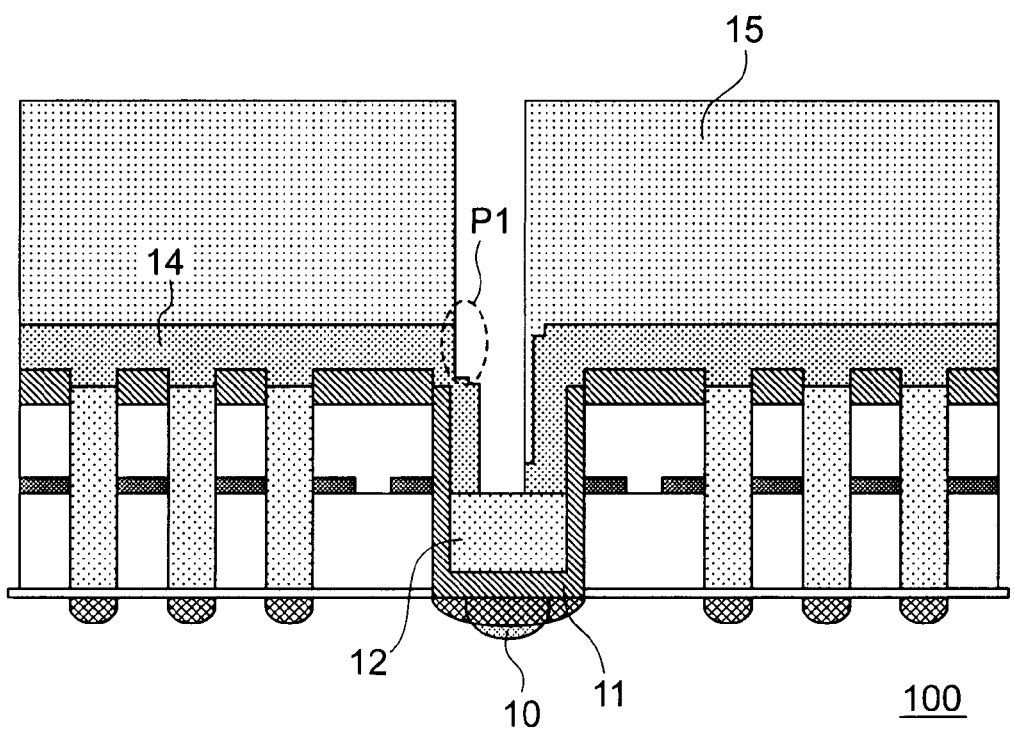
FIG. 12 is a schematic view showing still another cross-sectional process drawing of a method of manufacturing the semiconductor device in accordance with the first embodiment of the present invention.

As shown in FIG. 12, if the silicon nitride film 14 is etched under the etching condition that a silicon nitride film has a higher selection ratio than a silicon dioxide film, the part P1 of the vertical step etched away in preceding processes is likewise deepened further by etching while etching proceeds as far as the top surface of the silicon dioxide film 12.

Figure 13:
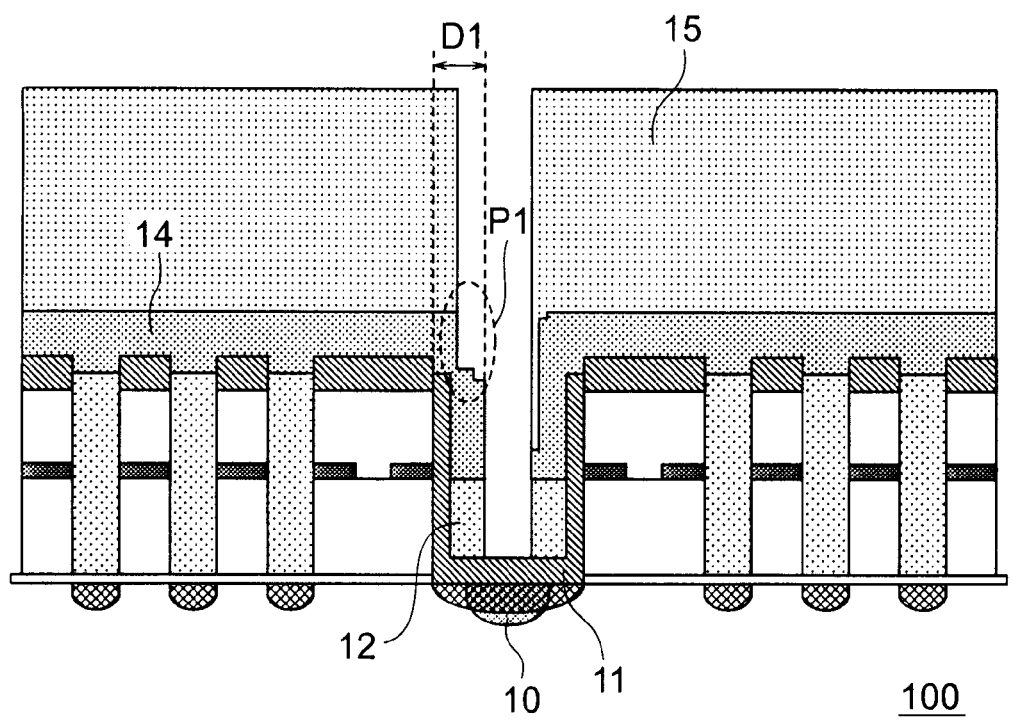
FIG. 13 is a schematic view showing still another cross-sectional process drawing of a method of manufacturing the semiconductor device in accordance with the first embodiment of the present invention.

As shown in FIG. 13, the silicon dioxide film 12 is etched under the etching condition that a silicon dioxide film has a higher selection ratio than a silicon nitride film. The part P1 of the vertical step 17 is etched away further while the etching of the silicon dioxide film 12 proceeds as far as the top surface of the silicon nitride film 11 between the select transistors 2.

However, the amount etched away here is smaller than that of the silicon dioxide film 12 due to a difference in the selection ratio. In addition, only the part P1 of the vertical step 17 is etched away and, thus, the distance D1 of the vertical surface thereof from the side surface of each select transistor 2 is still maintained at the base of the vertical step 17.

Accordingly, the region where the silicon dioxide film 12 has been etched away also has the distance D1 or greater from the side surface of each select transistor 2.

Figure 14:
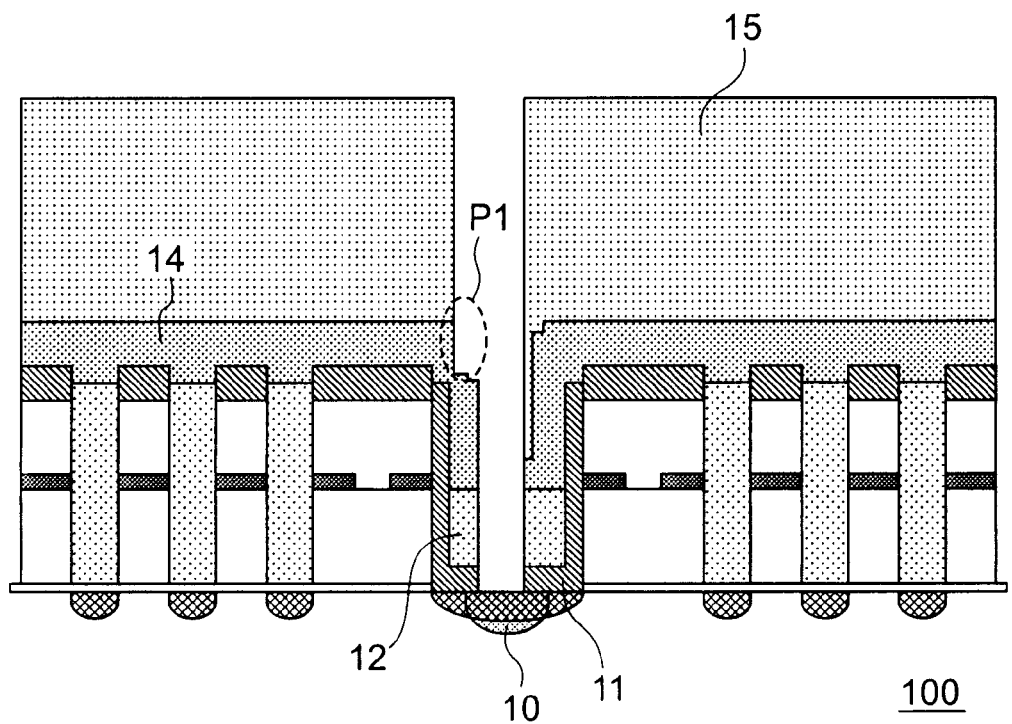
FIG. 14 is a schematic view showing still another cross-sectional process drawing of a method of manufacturing the semiconductor device in accordance with the first embodiment of the present invention.

As shown in FIG. 14, if the silicon nitride film 11 is etched under the etching condition that a silicon nitride film has a higher selection ratio than a silicon dioxide film, the part P1 of the vertical step already etched away in preceding processes is likewise deepened further by etching while etching proceeds as far as the top surface of the high-concentration impurity-diffused layer 10.

Since the region where the silicon dioxide film has been etched away in preceding processes has the distance D1 or greater from the side surface of each select transistor 2, the silicon nitride film 11 removed at this point also has the distance D1 or greater from the side surface of each select transistor 2.

Figure 15:
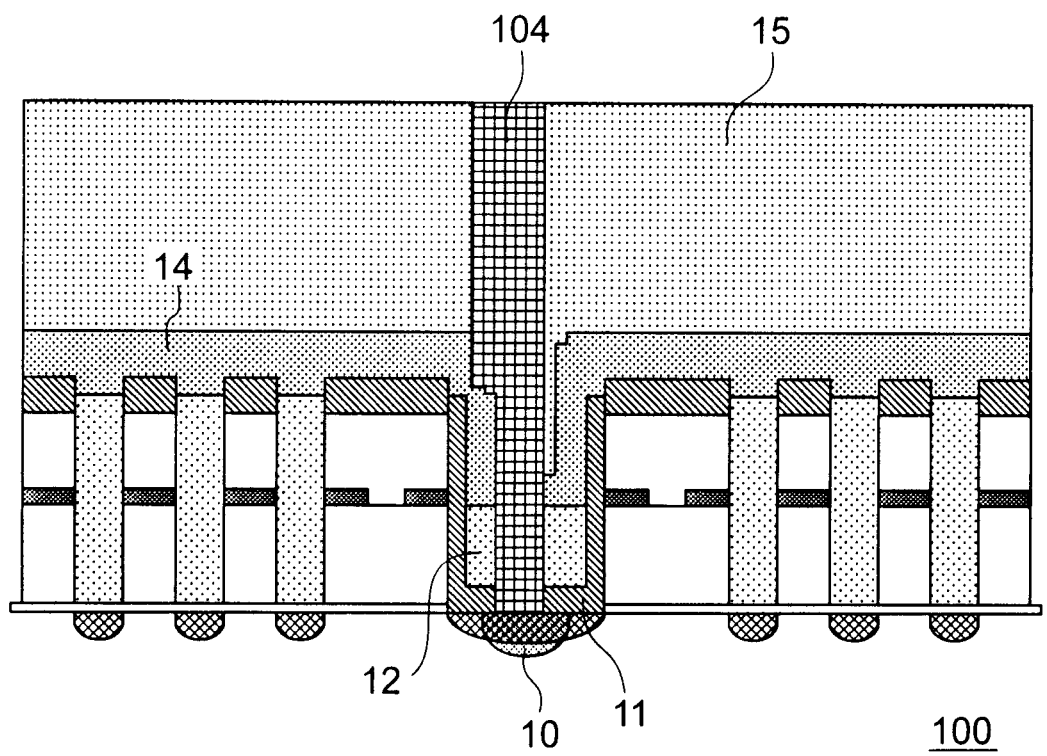
FIG. 15 is a schematic view showing still another cross-sectional process drawing of a method of manufacturing the semiconductor device in accordance with the first embodiment of the present invention.

Then, as shown in FIG. 15, a Ti/TiN laminated barrier metal film and a W film are buried using a publicly-known technique in the contact hole 103 created by the above-described etching and planarized using a CMP method, thereby forming a bit line contact 104.

By keeping the height of the vertical step 17 sufficiently larger than the total thickness of the silicon nitride film 11 and the silicon nitride film 14, it is possible to prevent the bit line contact from protruding out of the high-concentration impurity-diffused layer 10. This is because the base of the vertical step 17 remains at the completion of etching and, therefore, the region where the silicon nitride film 11 is etched away never comes closer to the select transistor 2 than the vertical surface of the vertical step 17 having the distance D1 from the side surface of each select transistor 2.

COMPARATIVE EXAMPLE

Now, an explanation will be made of a method of manufacturing a semiconductor device according to a comparative example. The comparative example is the same as the above-described first embodiment up to the process of removing the silicon nitride film 7 and parts of the silicon nitride film 11 and the silicon dioxide films 9 and 12 to expose the surfaces of the control gate electrodes 6 of the memory cell transistors 1 and the surfaces of the polysilicon films 102 for wiring the gates of the select transistors and peripheral transistors using the dry etching method illustrated in FIGS. 1 to 5 and, therefore, will not be explained further with respect to these processes.

Figure 16:
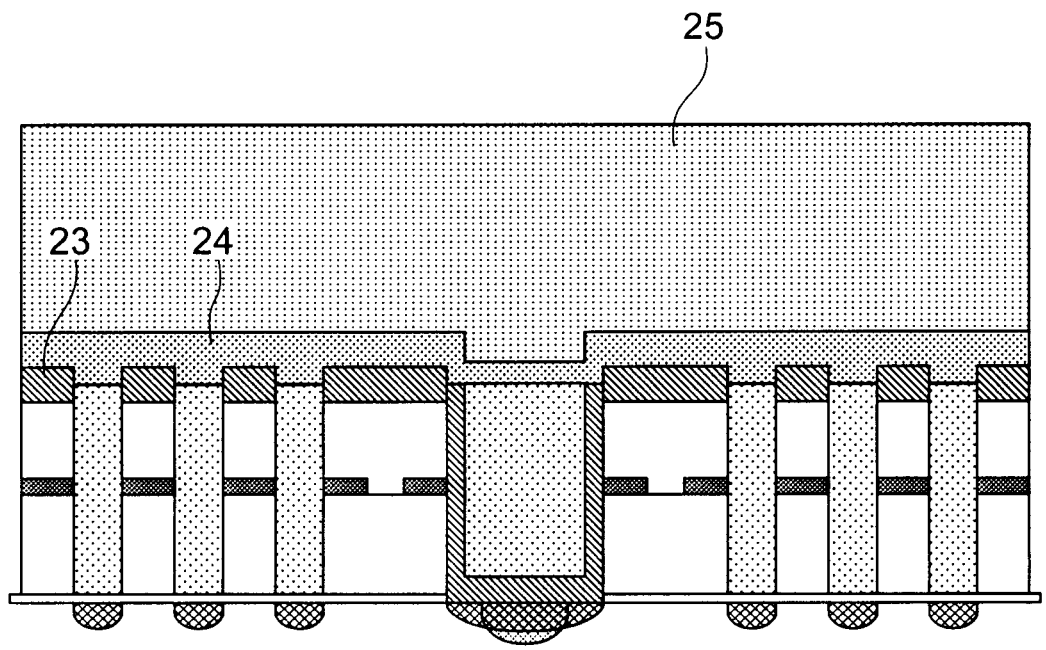
FIG. 16 is a schematic view showing a cross-sectional process drawing of a method of manufacturing a semiconductor device according to a comparative example.

As shown in FIG. 16, a silicide film 23 formed of Ti, Co or Ni is formed on the surface of polysilicon exposed using a publicly-known salicide technique, a silicon nitride film 24 is deposited using a CVD method, and a silicon dioxide film 25 is further deposited also using a CVD method.

Figure 17:
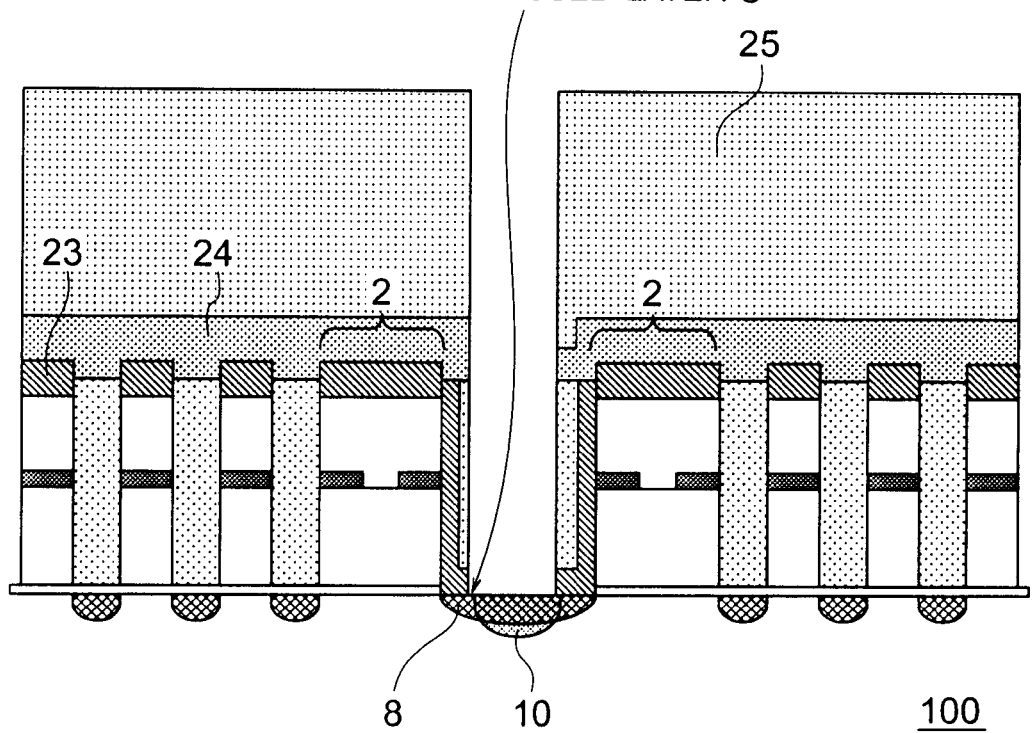
FIG. 17 is a schematic view showing another cross-sectional process drawing of a method of manufacturing the semiconductor device according to a comparative example.

Using lithography and dry etching methods, a contact hole is created between the select transistors 2. If the position to create a contact hole in is displaced due to misalignment in lithography, as shown in FIG. 17, part of the base of a bit line contact protrudes into the low-concentration impurity-diffused layer 8 when the bit line contact is formed by burying a Ti/TiN laminated barrier metal film and a W film in this contact hole.

Since the low-concentration impurity-diffused layer 8 is designed to be shallower than the high-concentration impurity-diffused layer 10, Ti and the substrate (silicon) react with each other in the low-concentration impurity-diffused layer 8 to form a Ti silicide when filling the contact hole with the Ti/TiN laminated barrier metal film and the W film, resulting in junction leakage.

In addition, a depletion layer is formed on the surface of the low-concentration impurity-diffused layer 8 near the select transistors 2 due to electric fields thereof and a Ti silicide is formed in the depletion layer, resulting in bit line leakage.

As described above, the method of manufacturing a semiconductor device according to the comparative example will lead to the low reliability of manufactured semiconductor devices. As measures against this problem, it is conceivable to reduce the size of the contact (contact hole) or increase the distance between the select transistors 2. However, reducing the size of the contact hole makes it difficult to ensure a sufficient lithographic margin when forming a resist pattern for contacts in lithography, thereby leading to a decrease in the yield. Furthermore, increasing the distance between the select transistors 2 involves an increase in the chip size, resulting in a decrease in the number of chips produced from a single wafer.

On the other hand, in the method of manufacturing a semiconductor device in accordance with the above-described first embodiment of the present invention, it is possible to prevent the base of the bit line contact from protruding out of the high-concentration impurity-diffused layer, without increasing the distance between the select transistors and while ensuring a sufficient lithographic margin.

Second Embodiment

Now, an explanation will be made of a method of manufacturing a semiconductor device in accordance with the second embodiment of the present invention using FIGS. 18 to 25. The second embodiment is the same as the above-described first embodiment up to the process of removing the silicon nitride film 7 and parts of the silicon nitride film 11 and the silicon dioxide films 9 and 12 to expose the surfaces of the control gate electrodes 6 of the memory cell transistors 1 and the surfaces of the polysilicon films 102 for wiring the gates of the select transistors and peripheral transistors, using the dry etching method illustrated in FIGS. 1 to 5 and, therefore, will not be explained further with respect to these processes.

Figure 18:
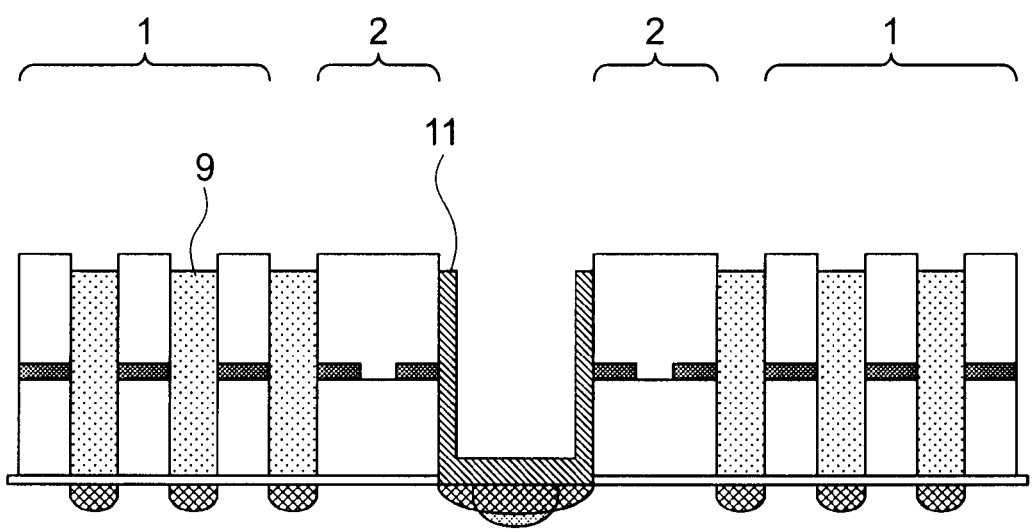
FIG. 18 is a schematic view showing a cross-sectional process drawing of a method of manufacturing a semiconductor device in accordance with the second embodiment of the present invention.

As shown in FIG. 18, the silicon dioxide film 12 buried between the select transistors 2 is entirely removed using a lithography method and a wet etching or dry etching method with the silicon nitride film 11 used as a stopper film. The present embodiment differs from the above-described first embodiment, wherein only part of the silicon dioxide film 12 is removed as shown in FIG. 6, in that the silicon dioxide film 12 is removed entirely.

Figure 19:
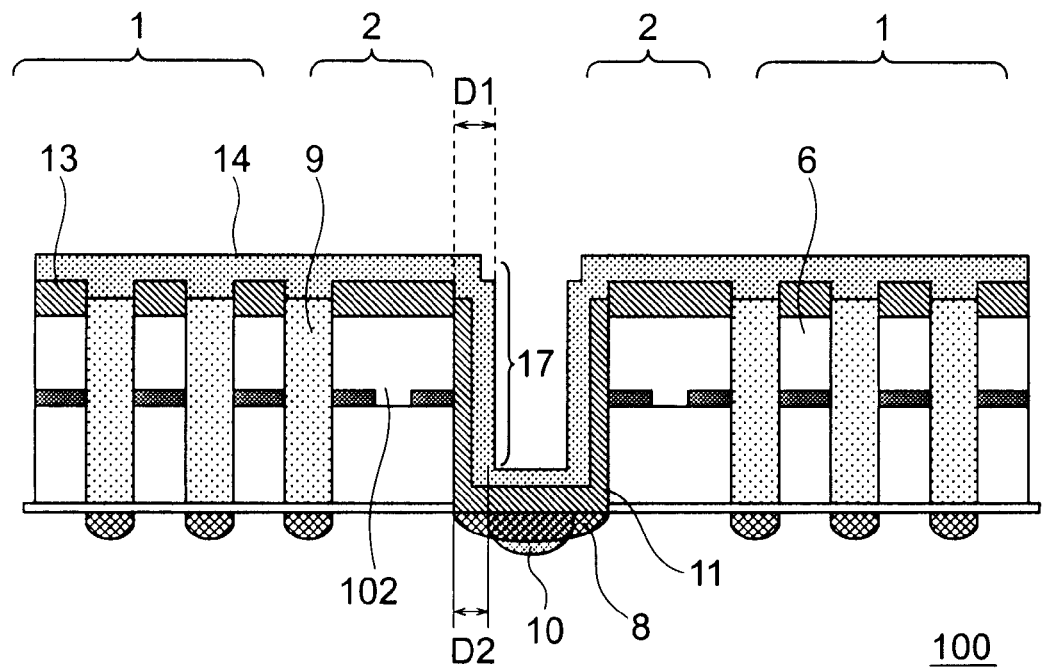
FIG. 19 is a schematic view showing another cross-sectional process drawing of a method of manufacturing the semiconductor device in accordance with the second embodiment of the present invention.

As shown in FIG. 19, a silicide film 13 formed of titanium (Ti), cobalt (Co) or nickel (Ni) is formed on the top surface of exposed polysilicon (control gate electrodes 6 and gate electrodes 102) using a publicly-known salicide technique.

In addition, a silicon nitride film 14 is deposited using a CVD method, so as to cover the top surfaces of the silicon dioxide film 9, memory cell transistors 1 and select transistors 2 and the side surfaces and the bottom surface of an area between the select transistors 2. Consequently, a vertical step 17 formed of a silicon nitride film is formed on the lateral sides of the select transistors 2.

Assuming here that the distance from the side surface of each select transistor 2 to the vertical surface of the vertical step 17 (total thickness of the silicon nitride films 11 and 14) is D1 and the distance from the side surface of each select transistor 2 to the end of the high-concentration impurity-diffused layer 10 (region the impurity concentration of which is higher than that of the low-concentration impurity-diffused layer 8) is D2, the silicon nitride film 14 is deposited so that $D1 \geq D2$ holds true. The thickness of the silicon nitride film 14 is, for example, 40 nm.

Figure 20:
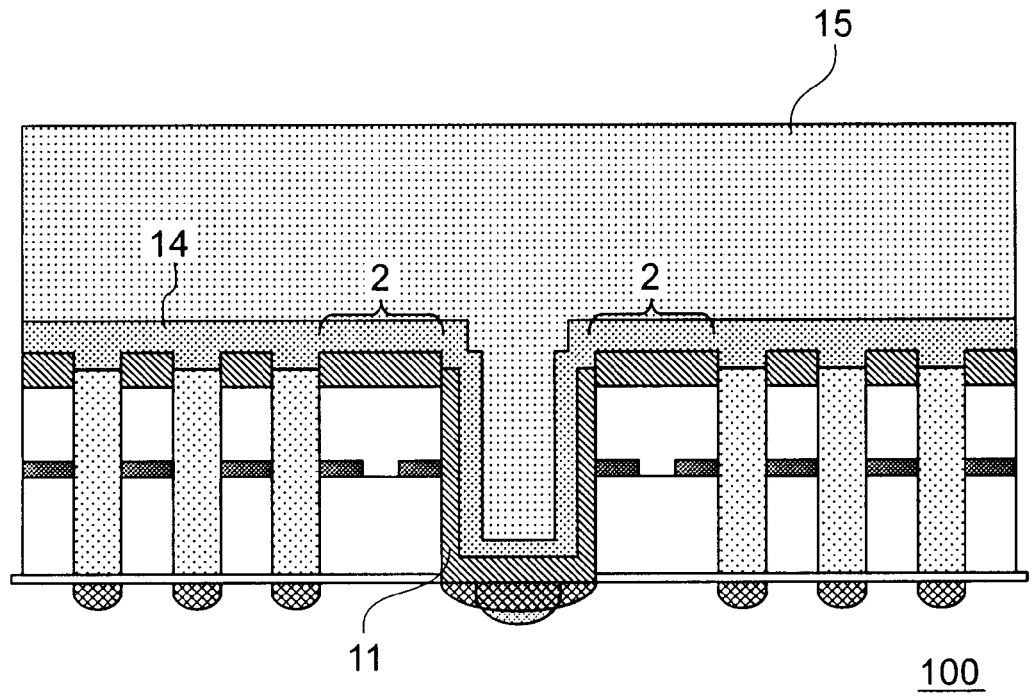
FIG. 20 is a schematic view showing yet another cross-sectional process drawing of a method of manufacturing the semiconductor device in accordance with the second embodiment of the present invention.

As shown in FIG. 20, a silicon dioxide film 15 is deposited so as to fill a space between the select transistors 2.

Figure 21:
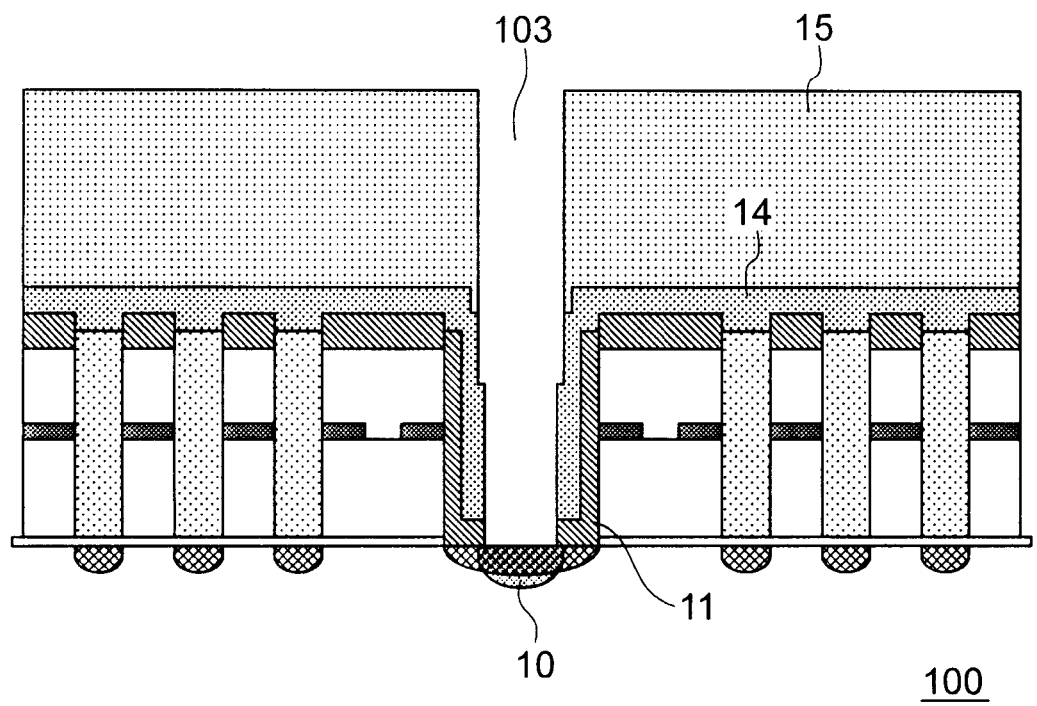
FIG. 21 is a schematic view showing still another cross-sectional process drawing of a method of manufacturing the semiconductor device in accordance with the second embodiment of the present invention.

As shown in FIG. 21, a contact hole 103 is created between the select transistors 2 using lithography and dry etching methods. At the time of dry etching, the silicon dioxide film 15 is first etched under the etching condition that a silicon dioxide film has a higher selection ratio than a silicon nitride film.

Next, the silicon nitride film 14 and the silicon nitride film 11 are etched under the etching condition that a silicon nitride film has a higher selection ratio than a silicon dioxide film. Note that this series of etching may be carried out within the same chamber.

Figure 22:
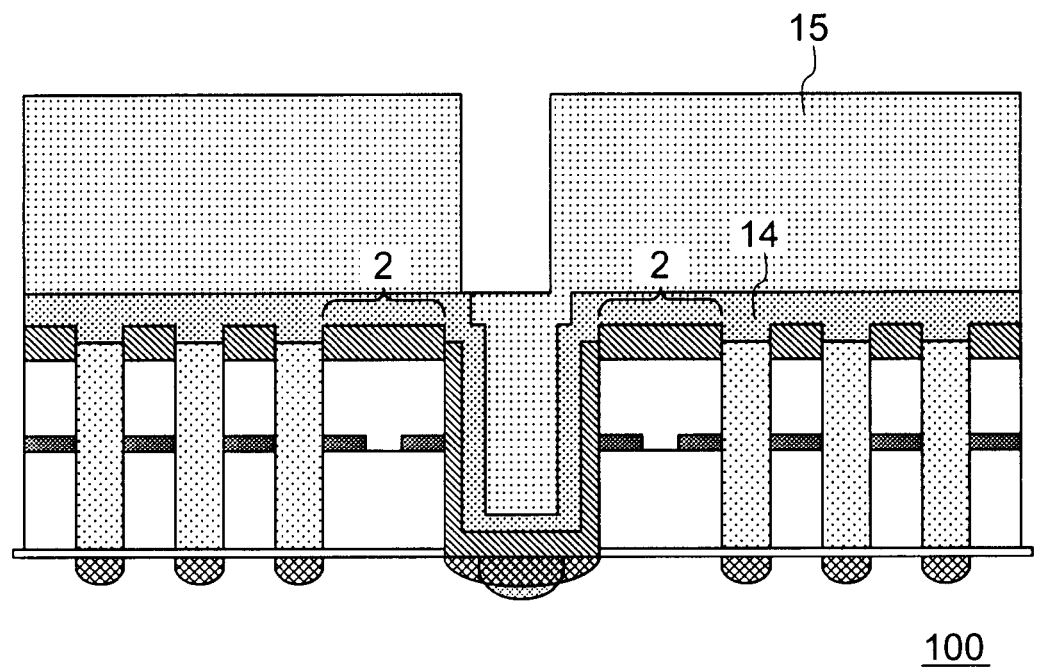
FIG. 22 is a schematic view showing still another cross-sectional process drawing of a method of manufacturing the semiconductor device in accordance with the second embodiment of the present invention.

As shown in FIG. 22, for example, if the position to create a contact hole in is displaced due to misalignment in lithography, the etching of the silicon dioxide film 15 proceeds as far as the top surface of the silicon nitride film 14 on the select transistors 2 with this position of contact hole creation kept displaced.

Figure 23:
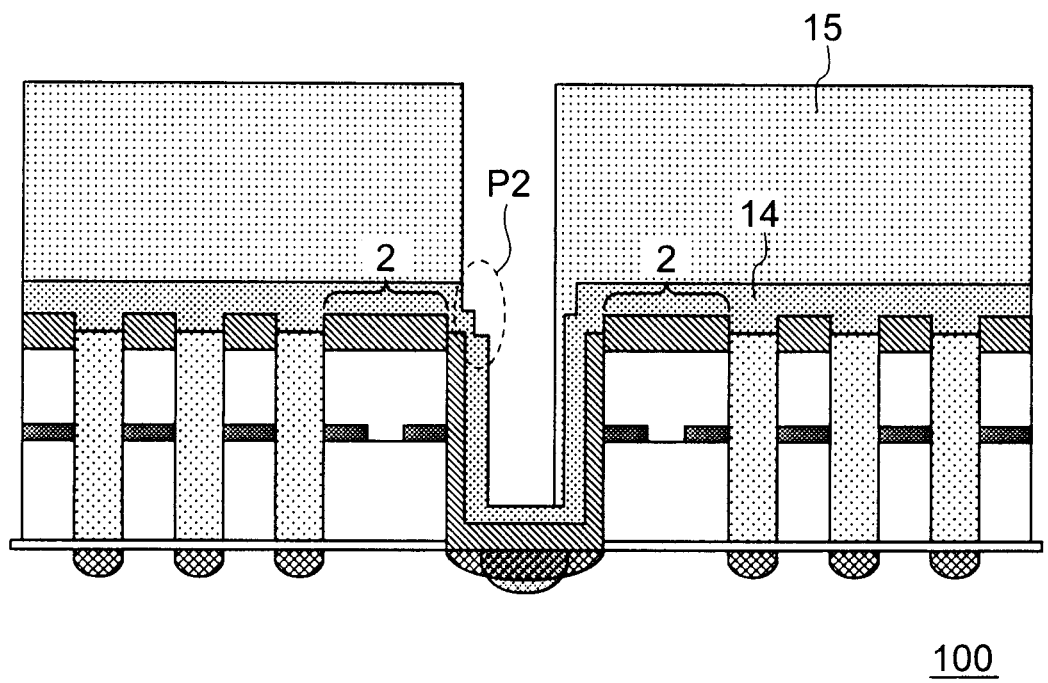
FIG. 23 is a schematic view showing still another cross-sectional process drawing of a method of manufacturing the semiconductor device in accordance with the second embodiment of the present invention.

Since etching is carried out under the etching condition that a silicon dioxide film has a higher selection ratio than a silicon nitride film, the part P2 of the vertical step 17 is subsequently etched away, as shown in FIG. 23, while the etching of the silicon dioxide film 15 proceeds as far as the top surface of the silicon nitride film 14 between the select transistors 2. The etched away amount of this part P2 is smaller than that of the silicon dioxide film 15 due to a difference in the selection ratio.

Figure 24:
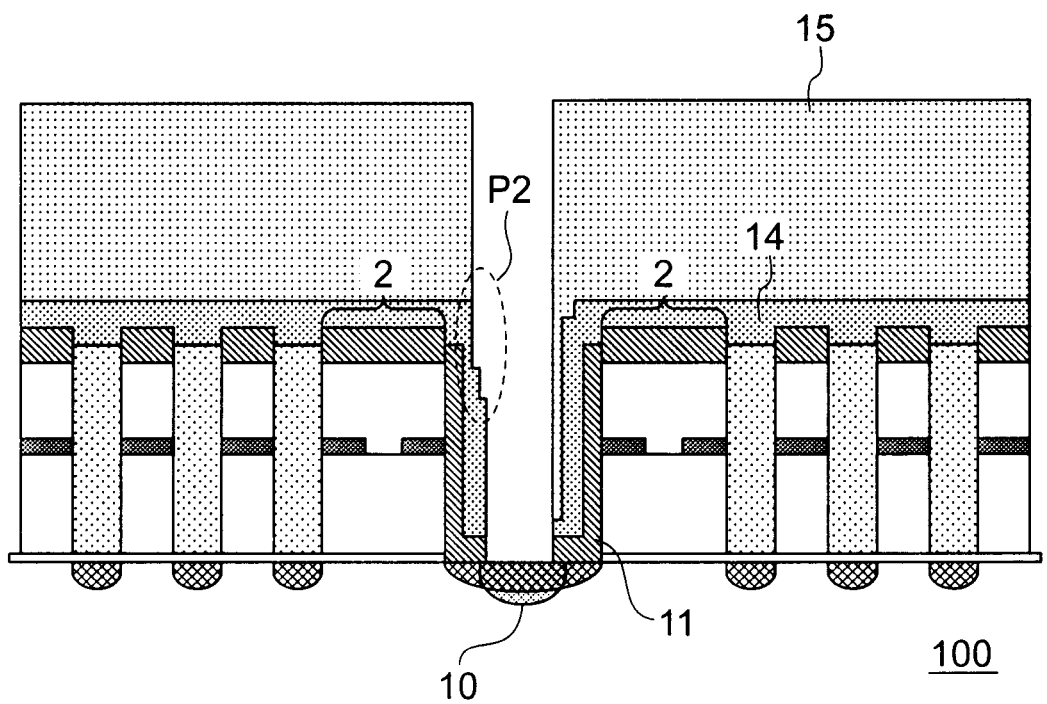
FIG. 24 is a schematic view showing still another cross-sectional process drawing of a method of manufacturing the semiconductor device in accordance with the second embodiment of the present invention.

Then, as shown in FIG. 24, if the silicon nitride films 14 and 11 are etched under the etching condition that a silicon nitride film has a higher selection ratio than a silicon dioxide film, the part P2 of the vertical step etched away in preceding processes is likewise deepened further by etching while etching proceeds as far as the top surface of the high-concentration impurity-diffused layer 10.

Since the region where the silicon dioxide film has been etched away in preceding processes has the distance D1 or greater from the side surface of each select transistor 2, the silicon nitride films 14 and 11 removed at this point also have the distance D1 or greater from the side surface of each select transistor 2.

Figure 25:
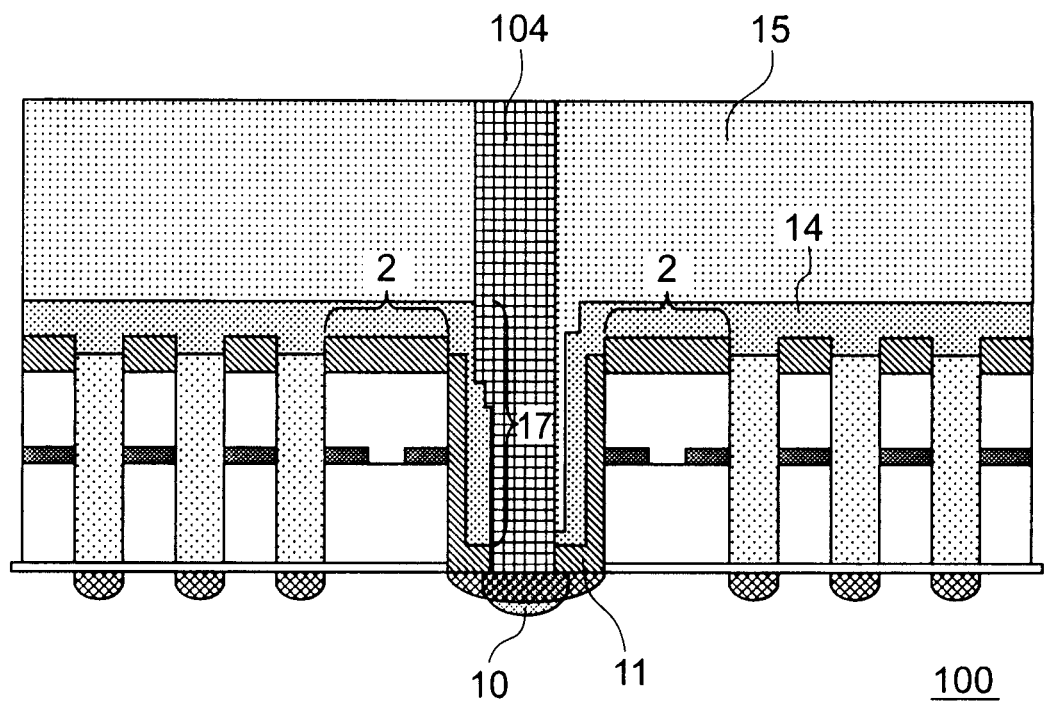
FIG. 25 is a schematic view showing still another cross-sectional process drawing of a method of manufacturing the semiconductor device in accordance with the second embodiment of the present invention.

Then, as shown in FIG. 25, a Ti/TiN laminated barrier metal film and a W film are buried using a publicly-known technique in the contact hole created by the above-described etching, thereby forming a bit line contact 104.

Consequently, the base of the vertical step 17 remains at the completion of etching and, therefore, the region where the silicon nitride films 14 and 11 are etched away never comes closer to the select transistors 2 than the vertical surface of the vertical step 17 having the distance D1 from the side surface of each select transistor 2. Accordingly, it is possible to prevent the bit line contact from protruding out of the high-concentration impurity-diffused layer 10.

As described above, according to the method of manufacturing a semiconductor device in accordance with the above-described second embodiment of the present invention, it is possible to prevent the base of the bit line contact from protruding out of the high-concentration impurity-diffused layer without increasing the distance between the select transistors and while ensuring a sufficient lithographic margin.

In the present embodiment, since it is possible to ensure the vertical step 17 to be significantly high, compared with the case in the above-described first embodiment, it is easy to leave over the base of the vertical step 17 at the time of etching to create a contact hole. In addition, it is possible to reduce the frequency of switching between etching conditions, compared with the case in the above-described first embodiment.

Furthermore, in the present embodiment, etching never proceeds deep into the element-isolating region even if the silicon nitride films, when etched, do not have a sufficiently high selection ratio with respect to the silicon dioxide films, since there is no need to etch silicon dioxide films after having etched the silicon nitride films 14 and 11.

However, in the present embodiment, care must be taken to prevent voids from arising during deposition, since the aspect ratio of an area between the select transistors 2 increases when the silicon dioxide film 15 is deposited.

Third Embodiment

Now, an explanation will be made of a method of manufacturing a semiconductor device in accordance with the third embodiment of the present invention using FIGS. 26 to 37. The third embodiment is the same as the above-described first embodiment up to the process of depositing a silicon dioxide film 9 using the CVD method illustrated in FIGS. 1 and 2, forming spacers 9' on the lateral sides of select transistors 2 by etching back the silicon dioxide film 9 using a dry etching method, and forming a high-concentration impurity-diffused layer 10 between the select transistors 2 and in peripheral transistors using lithography and ion implantation methods and, therefore, will not be explained further with respect to these processes.

Figure 26:
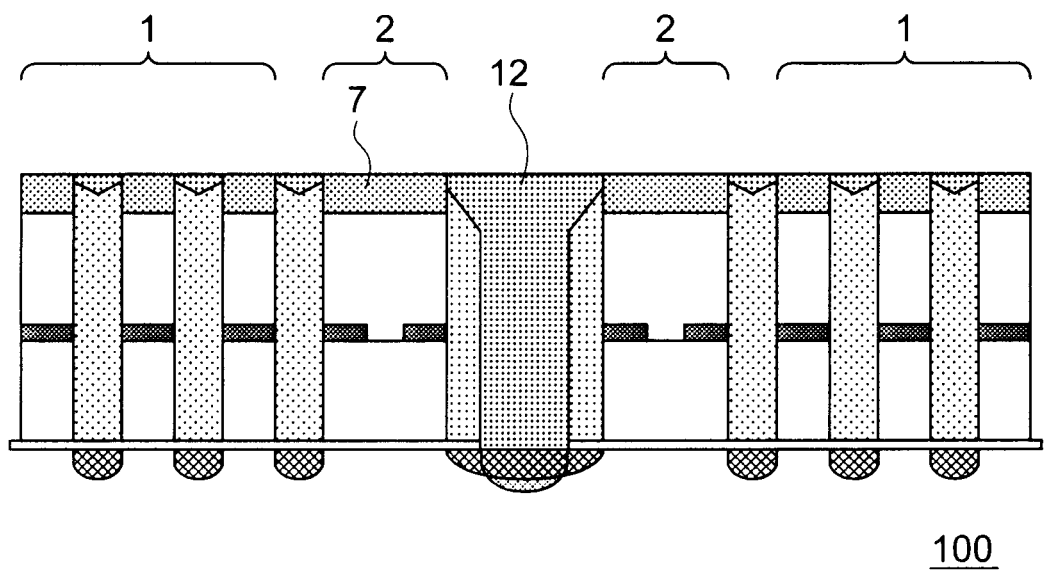
FIG. 26 is a schematic view showing a cross-sectional process drawing of a method of manufacturing a semiconductor device in accordance with the third embodiment of the present invention.

As shown in FIG. 26, a silicon dioxide film 12 is deposited using a CVD method, so as to fill a space between the select transistors 2 and planarized using a CMP method with the silicon nitride film 7 used as a stopper film.

Figure 27:
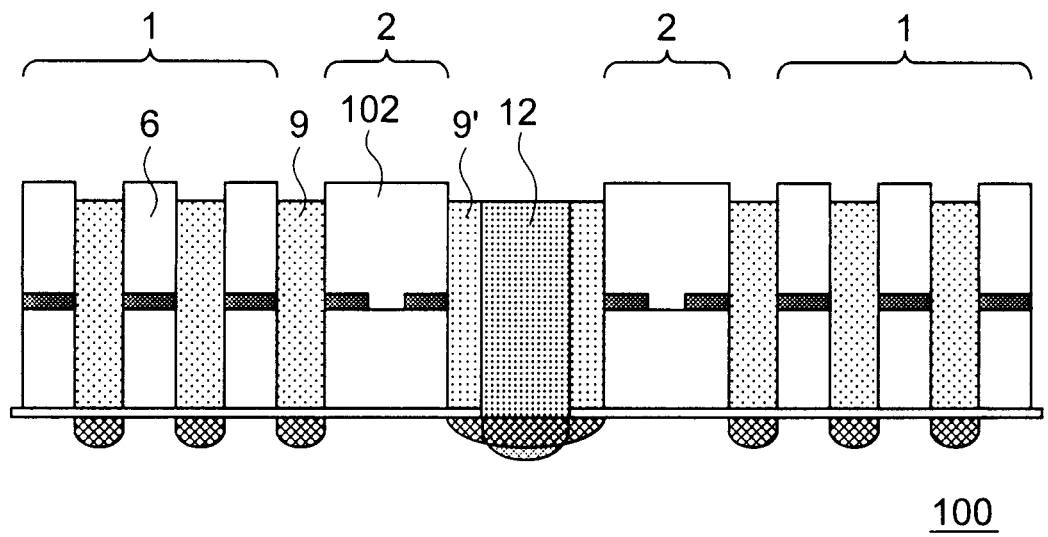
FIG. 27 is a schematic view showing another cross-sectional process drawing of a method of manufacturing the semiconductor device in accordance with the third embodiment of the present invention.

As shown in FIG. 27, the silicon nitride film 7 and parts of the silicon dioxide films 9 (9') and 12 are removed, so as to expose the top surfaces of the control gate electrodes 6 of the memory cell transistors 1 and the gate electrodes 102 of the select transistors 2 and peripheral transistors using a dry etching method.

Figure 28:
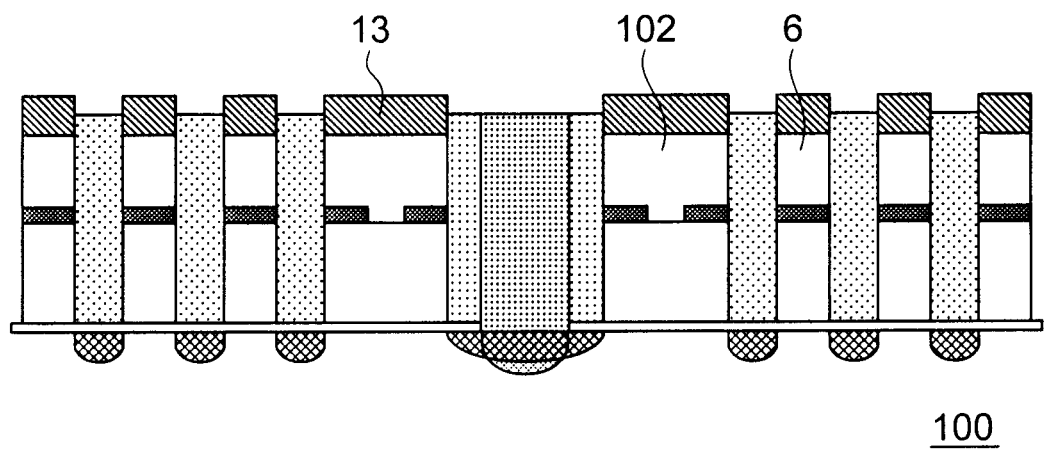
FIG. 28 is a schematic view showing yet another cross-sectional process drawing of a method of manufacturing the semiconductor device in accordance with the third embodiment of the present invention.

As shown in FIG. 28, a silicide film 13 formed of titanium (Ti), cobalt (Co), nickel (Ni) or the like is formed on the top surface of polysilicon (control gate electrodes 6 and gate electrodes 102) exposed using a publicly-known salicide technique.

Figure 29:
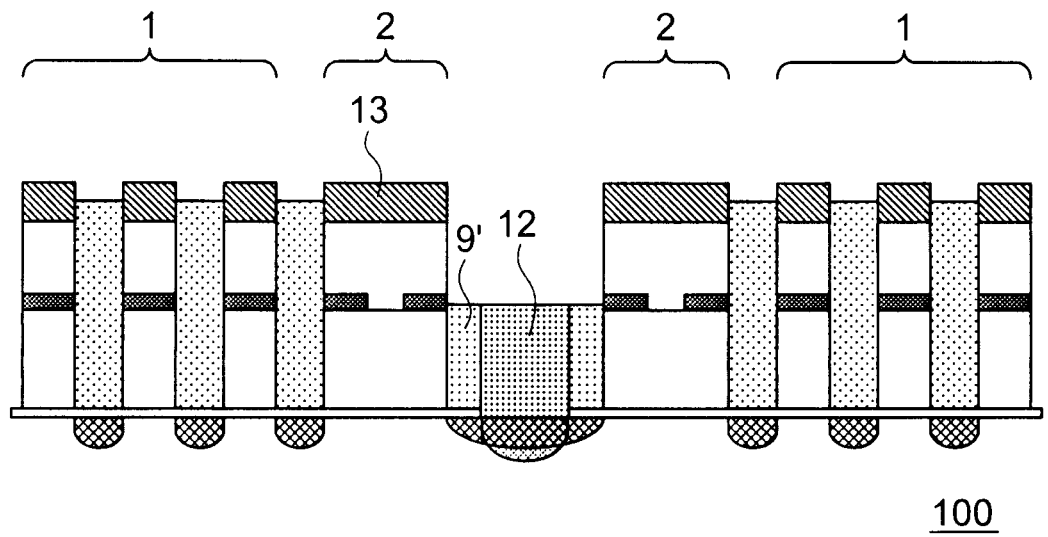
FIG. 29 is a schematic view showing still another cross-sectional process drawing of a method of manufacturing the semiconductor device in accordance with the third embodiment of the present invention.

As shown in FIG. 29, parts of the silicon dioxide film 12 and the silicon dioxide films 9 (spacers 9') buried between the select transistors 2 are removed using lithography and dry etching methods.

Figure 30:
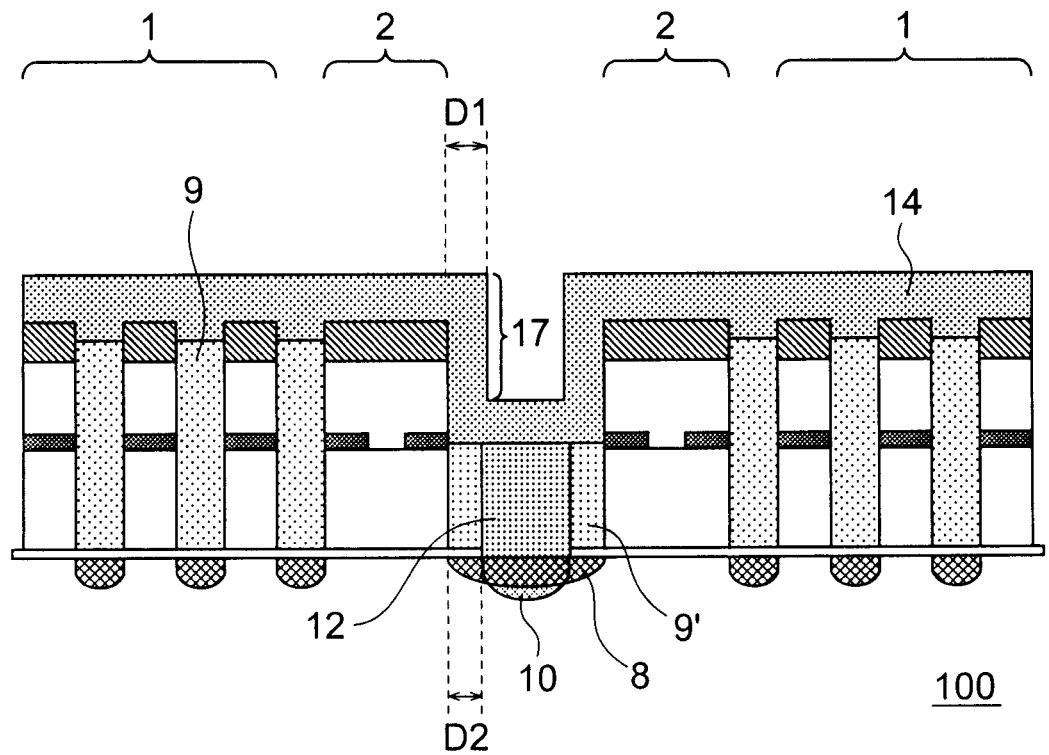
FIG. 30 is a schematic view showing still another cross-sectional process drawing of a method of manufacturing the semiconductor device in accordance with the third embodiment of the present invention.

As shown in FIG. 30, a silicon nitride film 14 is deposited to a thickness of, for example, 60 nm using a CVD method, so as to cover the top surfaces of the silicon dioxide film 9, memory cell transistors 1 and select transistors 2 and the side surfaces and the bottom surface (top surfaces of the spacers 9' and the silicon dioxide film 12) of an area between the select transistors 2, to form a vertical step 17.

Assuming here that the distance from the side surface of each select transistor 2 to the vertical surface of the vertical step 17 (thickness of the silicon nitride film 14) is D1 and the distance from the side surface of each select transistor 2 to the end of the high-concentration impurity-diffused layer 10 (region the impurity concentration of which is higher than that of the low-concentration impurity-diffused layer 8) is D2, the silicon nitride film 14 is deposited so that D1≧D2 holds true.

Figure 31:
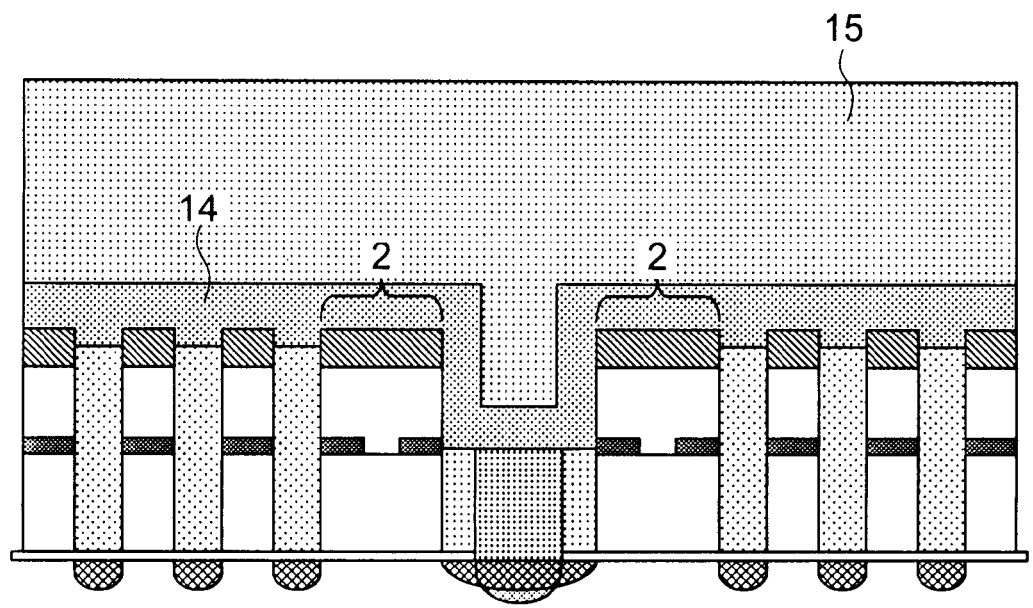
FIG. 31 is a schematic view showing still another cross-sectional process drawing of a method of manufacturing the semiconductor device in accordance with the third embodiment of the present invention.

As shown in FIG. 31, a silicon dioxide film 15 is deposited using a CVD method, so as to fill a space between the select transistors 2.

Figure 32:
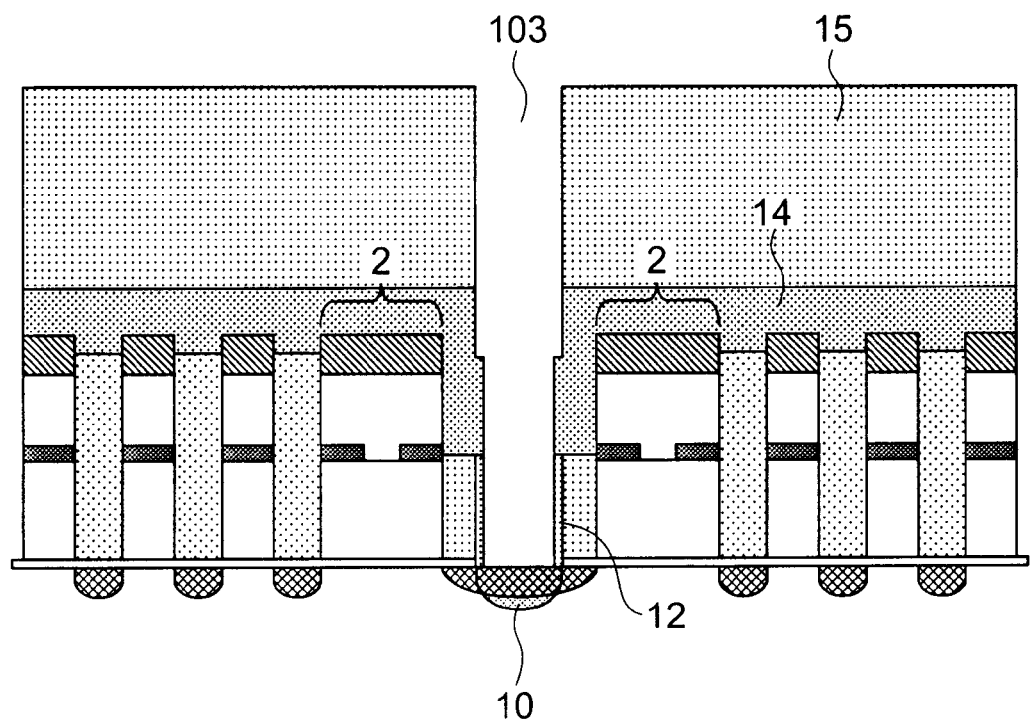
FIG. 32 is a schematic view showing still another cross-sectional process drawing of a method of manufacturing the semiconductor device in accordance with the third embodiment of the present invention.

As shown in FIG. 32, a contact hole 103 is created between the select transistors 2 using lithography and dry etching methods. At the time of dry etching, the silicon dioxide film 15 is first etched under the etching condition (defined as condition 1) that a silicon dioxide film has a higher selection ratio than a silicon nitride film.

Next, the silicon nitride film 14 is etched under the etching condition that a silicon nitride film has a higher selection ratio than a silicon dioxide film.

Then, the silicon dioxide film 12 is etched under condition 1 to expose the top surface of the high-concentration impurity-diffused layer 10. Note that this series of etching may be carried out within the same chamber.

Figure 33:
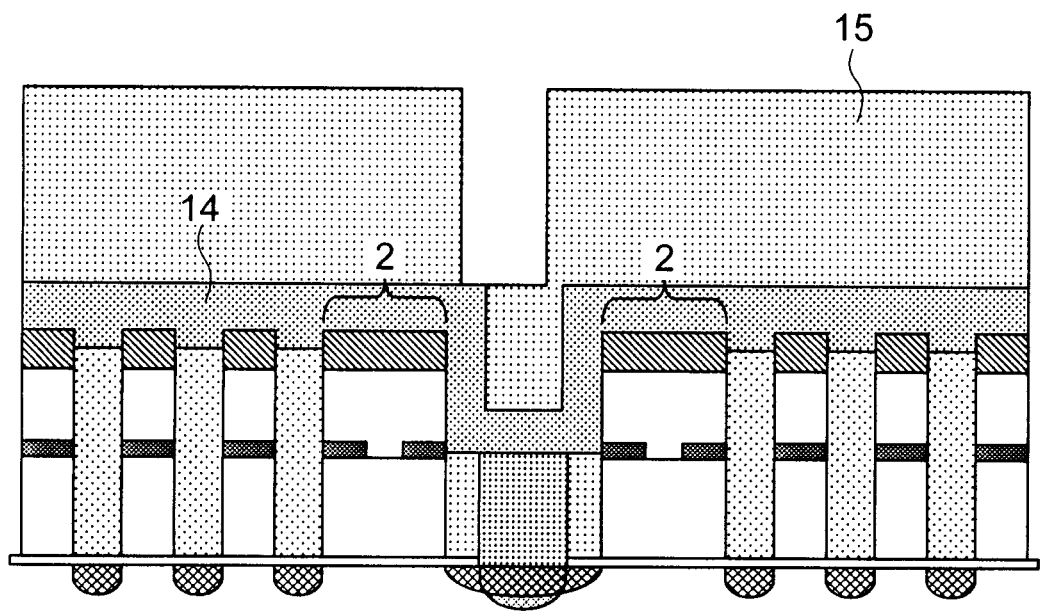
FIG. 33 is a schematic view showing still another cross-sectional process drawing of a method of manufacturing the semiconductor device in accordance with the third embodiment of the present invention.

As shown in FIG. 33, for example, if the position to create a contact hole in is displaced due to misalignment in lithography, the etching of the silicon dioxide film 15 proceeds as far as the top surface of the silicon nitride film 14 on the select transistors 2 with this position of contact hole creation kept displaced.

Figure 34:
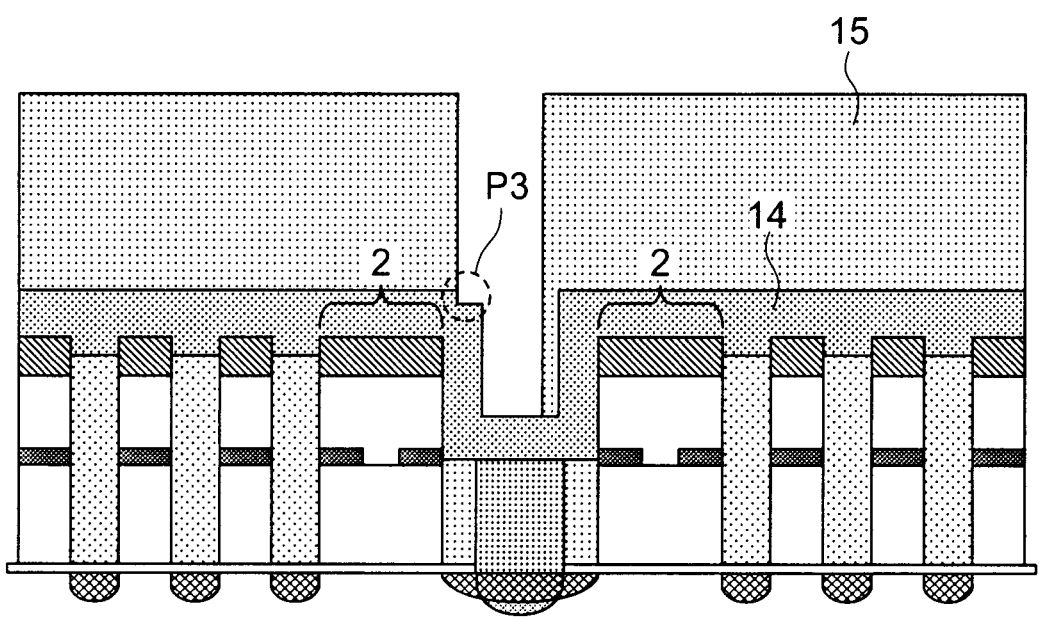
FIG. 34 is a schematic view showing still another cross-sectional process drawing of a method of manufacturing the semiconductor device in accordance with the third embodiment of the present invention.

Since etching is carried out under the etching condition that a silicon dioxide film has a higher selection ratio than a silicon nitride film, the part P3 of the vertical step 17 is subsequently etched away, as shown in FIG. 34, while the etching of the silicon dioxide film 15 proceeds as far as the top surface of the silicon nitride film 14 between the select transistors 2. The etched away amount of this part P3 is smaller than that of the silicon dioxide film 15 due to a difference in the selection ratio.

Figure 35:
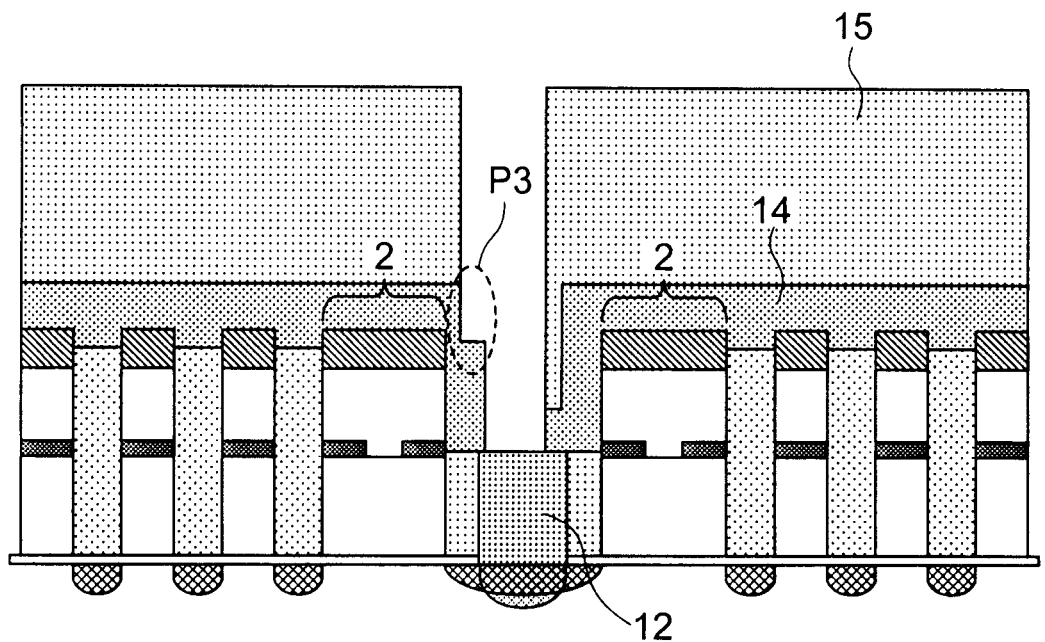
FIG. 35 is a schematic view showing still another cross-sectional process drawing of a method of manufacturing the semiconductor device in accordance with the third embodiment of the present invention.

As shown in FIG. 35, if the silicon nitride film 14 is etched under the etching condition that a silicon nitride film has a higher selection ratio than a silicon dioxide film, the part P3 of the vertical step etched away in preceding processes is likewise deepened further by etching while etching proceeds as far as the top surface of the silicon dioxide film 12.

Figure 36:
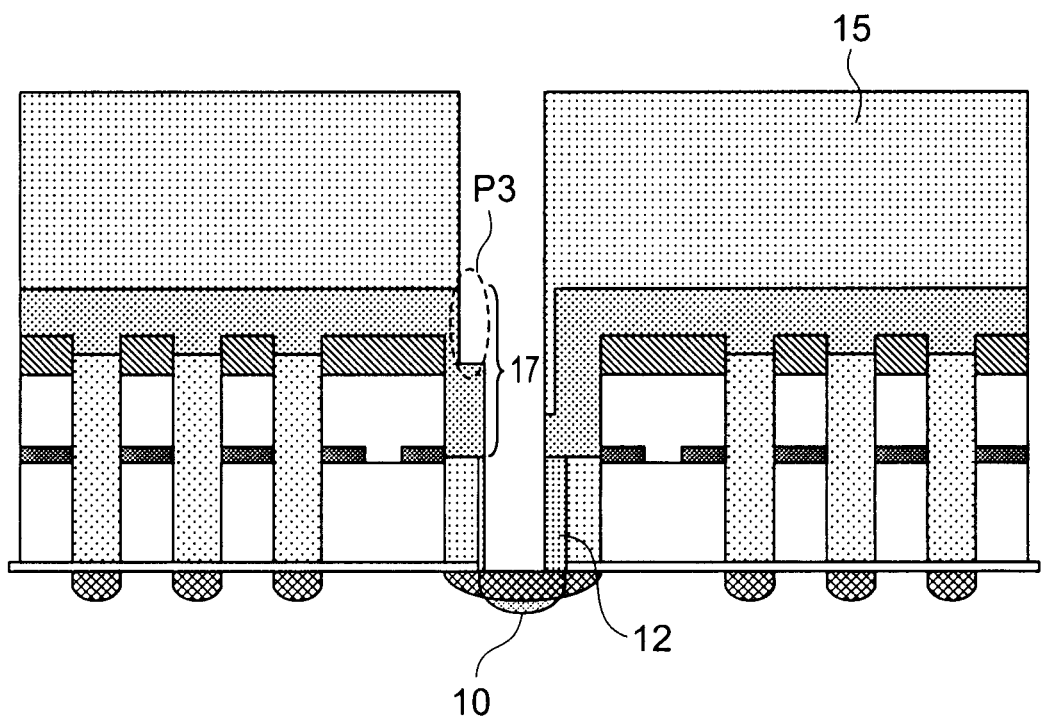
FIG. 36 is a schematic view showing still another cross-sectional process drawing of a method of manufacturing the semiconductor device in accordance with the third embodiment of the present invention.

As shown in FIG. 36, the silicon dioxide film 12 is etched under the etching condition that a silicon dioxide film has a higher selection ratio than a silicon nitride film. The part P3 of the vertical step 17 is etched away further while the etching of the silicon dioxide film 12 proceeds. However, the amount etched away here is smaller than that of the silicon dioxide film 12 due to a difference in the selection ratio.

In addition, only the part P3 of the vertical step 17 is etched away and thus the distance D1 of the vertical surface thereof from the side surface of each select transistor 2 is still maintained at the base of the vertical step 17. Accordingly, the region where the silicon dioxide film 12 has been etched away also has the distance D1 or greater from the side surface of each select transistor 2.

Figure 37:
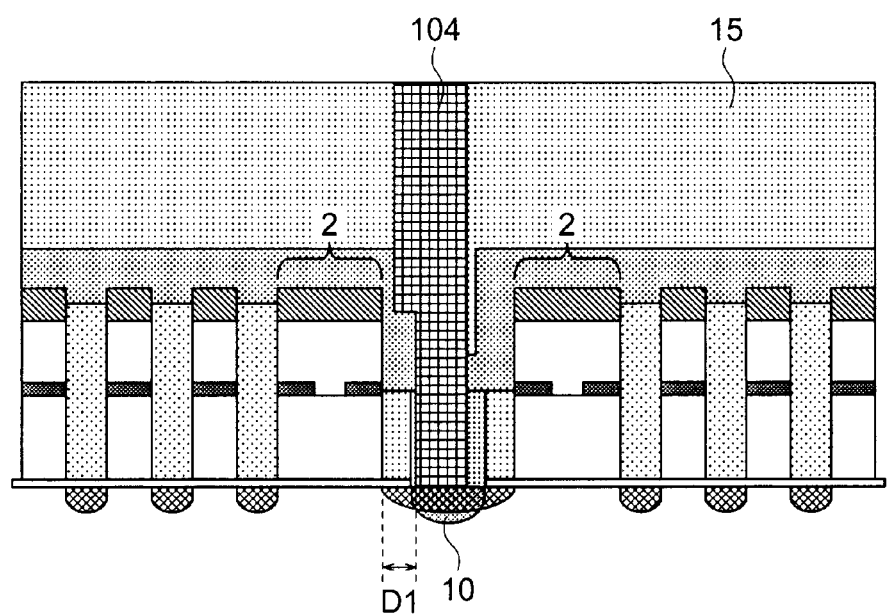
FIG. 37 is a schematic view showing still another cross-sectional process drawing of a method of manufacturing the semiconductor device in accordance with the third embodiment of the present invention.

Then, as shown in FIG. 37, a Ti/TiN laminated barrier metal film and a W film are buried using a publicly-known technique in the contact hole created by the above-described etching, thereby forming a bit line contact 104.

Sine the base of the contact hole to be created has a distance D1 from the side surface of each select transistor 2, the bit line contact does not protrude out of the high-concentration impurity-diffused layer 10.

As described above, according to the method of manufacturing a semiconductor device in accordance with the third embodiment of the present invention, it is possible to prevent the base of the bit line contact from protruding out of the high-concentration impurity-diffused layer without increasing the distance between the select transistors and while ensuring a sufficient lithographic margin.

The present embodiment, when compared with the above-described first embodiment, does not require the process of removing the spacers 9' formed on the lateral sides of the select transistors 2 and makes it possible to eliminate one process in which a silicon dioxide film is formed. Consequently, it is possible to reduce manufacturing costs.

In the present embodiment, although no stopper films (silicon nitride film 11 in the above-described first embodiment) are present when the silicon dioxide film 12 is etched, it is possible to prevent etching from proceeding deep into the element-isolating region by correctly setting the amount of overetch.

What is claimed is:

1. A semiconductor device, comprising:
   a semiconductor substrate;
   a transistor region formed on said semiconductor substrate and having a plurality of memory cell arrays formed of a plurality of memory cell transistors and select transistors, one of the select transistors being disposed on one side and another one of the select transistors being disposed on the other side of said plurality of memory cell transistors;
   a diffused layer formed on the surface of said semiconductor substrate between adjacent first and second select transistors of said memory cell arrays in said transistor region;
   a first sidewall film formed on each of the opposed sidewalls of said first and second select transistors adjacent to each other;
   a second sidewall film formed on said first sidewall film; and
   a conducting layer formed between said first and second select transistors, so as to contact with said diffused layer,
   wherein said second sidewall film is formed so as to cover at least part of the top surface and the side surface of said first sidewall film,
   said second sidewall film includes at least two surfaces forming a step portion,
   the two surfaces are directly contacted with said conducting layer, and
   said second sidewall film is a single layer and is formed along said first sidewall film under the step portion.

2. The semiconductor device according to claim 1, wherein the height of said second sidewall film is greater than the sum of the thicknesses of said first sidewall film and said second sidewall film.

3. The semiconductor device according to claim 1, wherein said diffused layer has a first impurity-diffused layer region and a second impurity-diffused layer region formed in the center thereof and having an impurity concentration higher than that of said first impurity-diffused layer region.

4. The semiconductor device according to claim 3, wherein said conducting layer contacts with said second impurity-diffused layer region.

5. The semiconductor device according to claim 1, wherein said first sidewall film and said second sidewall film are silicon nitride films.

6. The semiconductor device according to claim 1, wherein the step portion is a vertical step portion.

7. The semiconductor device according to claim 6, wherein the vertical step portion includes at least one step.

8. The semiconductor device according to claim 1, wherein the first sidewall film is directly contacted with the diffused layer.

9. The semiconductor device according to claim 1, wherein an upper part of the conducting layer has a width equal to or larger than a width of a lower part of the conducting layer.

10. The semiconductor device according to claim 3, wherein a total thickness of the first and the second sidewall films is no less than a distance from a side of one of the select transistors to an end of the second impurity-diffused layer region.

11. The semiconductor device according to claim 5, further comprising a silicon dioxide film surrounded by the first film and the conducting layer under the second sidewall film.

12. The semiconductor device according to claim 1, further comprising an insulating film around the conducting layer, and a material of the insulating film is different from a material of the second side wall film.

13. The semiconductor device according to claim 12, wherein the insulating film is surrounded by the first sidewall film and the conducting layer under the second sidewall film.

* * * * *